(12) United States Patent
Stokkermans et al.

(10) Patent No.: US 10,998,804 B2
(45) Date of Patent: May 4, 2021

(54) DEVICE, APPARATUS AND SYSTEM

(71) Applicant: NEXPERIA B.V., Nijmegen (NL)

(72) Inventors: Joep Stokkermans, Nijmegen (NL);
Tom Kampschreur, Nijmegen (NL);
Nailia Nasibulina, Nijmegen (NL)

(73) Assignee: NEXPERIA, B.V., Nijmegen (NL)

( * ) Notice: Subject to any disclaimer, the term of this patent is extended or adjusted under 35 U.S.C. 154(b) by 0 days.

(21) Appl. No.: 16/715,477

(22) Filed: Dec. 16, 2019

(65) Prior Publication Data
US 2020/0195111 A1 Jun. 18, 2020

(30) Foreign Application Priority Data

Dec. 17, 2018 (EP) .................................... 18212980

(51) Int. Cl.
*H02K 21/14* (2006.01)
*H01L 21/677* (2006.01)
(Continued)

(52) U.S. Cl.
CPC ....... *H02K 21/14* (2013.01); *H01L 21/67742* (2013.01); *H02K 1/12* (2013.01); *H02K 1/27* (2013.01); *H02P 25/06* (2013.01)

(58) Field of Classification Search
CPC ........... H01L 21/67742; H01L 21/6876; H01L 21/6714; H02K 21/14; H02K 21/12; H02K 41/031; H02P 23/0004; H02P 6/28
See application file for complete search history.

(56) References Cited

U.S. PATENT DOCUMENTS 4,281,263 A * 7/1981 Virolleau ............. B22D 11/122
310/13
5,627,418 A * 5/1997 Satomi .................... H02K 37/18
310/12.14
(Continued)

FOREIGN PATENT DOCUMENTS

EP 2412086 A1 2/2012
WO 2010109407 A1 9/2010

OTHER PUBLICATIONS

European Search Report and Written Opinion for corresponding application EP 18212980.9 11 pages, dated Jul. 2, 2019.

*Primary Examiner* — Kaitlin S Joerger
(74) *Attorney, Agent, or Firm* — Ohlandt, Greeley, Ruggiero & Perle, L.L.P.

(57) ABSTRACT

The disclosed device includes a single electric motor for linear and rotary movement with a stator. The stator includes a multi-phase coil arrangement with a plurality of coils or coil sets and a rotor. The rotor is movable in an axial direction of a rotational axis thereof and includes a plurality of poles respectively with at least one permanent magnet The device further includes a control unit operative to determine currents ($I_r$, $I_s$, $I_t$) by calculation formulas and based on at least a number of coils or coil sets of the plurality of coils or coil sets, and an angle of rotation of said rotor and a parameter depending on an axial position of the rotor. Each current ($I_r$, $I_s$, $I_t$) has a current component ($I_{r\Phi}$, $I_{s\Phi}$, $I_{t\Phi}$) for generating a torque and a current component ($I_{rx}$, $I_{sx}$, $I_{tx}$) for generating an axial force, and to supply the determined currents in open loop to the number of coils or coil sets, so that the sum of the currents is zero. Further, at least one of the stator and the rotor, includes a back-iron.

18 Claims, 20 Drawing Sheets

(51) Int. Cl.
*H02K 1/12* (2006.01)
*H02K 1/27* (2006.01)
*H02P 25/06* (2016.01)

(56) References Cited

U.S. PATENT DOCUMENTS

| | | | | |
|---|---|---|---|---|
| 5,882,165 | A * | 3/1999 | Maydan | H01L 21/67201 |
| | | | | 414/217 |
| 5,982,053 | A * | 11/1999 | Chitayat | H02K 41/03 |
| | | | | 310/12.21 |
| 6,429,611 | B1 * | 8/2002 | Li | H02K 21/14 |
| | | | | 318/115 |
| 6,570,275 | B2 * | 5/2003 | Kim | H02K 33/02 |
| | | | | 310/12.14 |
| 7,235,906 | B2 * | 6/2007 | Carroll | F16C 32/044 |
| | | | | 310/90.5 |
| 7,726,011 | B2 * | 6/2010 | Bosch | H01L 21/67144 |
| | | | | 29/739 |
| 8,841,869 | B2 * | 9/2014 | Angelis | H02P 25/06 |
| | | | | 318/135 |
| 9,177,842 | B2 * | 11/2015 | Englhardt | H01L 21/67742 |
| 9,230,841 | B2 * | 1/2016 | Gilchrist | H01L 21/67706 |
| 9,852,935 | B2 * | 12/2017 | Caveney | B25J 9/043 |
| 9,869,539 | B2 * | 1/2018 | Klimenko | G01D 5/2452 |
| 10,109,517 | B1 * | 10/2018 | Blank | H01L 21/68 |
| 10,141,214 | B2 * | 11/2018 | Pietrantonio | H01L 21/677 |
| 10,325,795 | B2 * | 6/2019 | Caveney | B25J 9/043 |
| 10,411,532 | B2 * | 9/2019 | Lee | H02K 19/103 |
| 10,600,665 | B2 * | 3/2020 | Caveney | H01L 21/67706 |
| 2004/0020601 | A1 * | 2/2004 | Zhao | H01L 21/0234 |
| | | | | 156/345.32 |
| 2016/0336207 | A1 * | 11/2016 | Stokkermans | H01L 21/6835 |
| 2019/0048465 | A1 * | 2/2019 | Kilpi | C23C 16/4584 |
| 2019/0096726 | A1 * | 3/2019 | Pietrantonio | B25J 9/043 |

* cited by examiner

DEVICE, APPARATUS AND SYSTEM

CROSS REFERENCE TO RELATED APPLICATIONS

This application claims the benefit under 35 U.S.C. § 119(a) of European Application No. 18212980.9 filed Dec. 17, 2018 the contents of which are incorporated by reference herein in their entirety.

BACKGROUND OF THE DISCLOSURE

1. Field of the Disclosure

The present disclosure generally relates to a device for enabling a rotating and translating movement by a single motor. The present disclosure also relates to an apparatus incorporating the device, and system incorporating the apparatus for transferring a semiconductor device from a wafer to a target position.

2. Description of the Related Art

A conventional brushless permanent magnet ironless rotating motor or other kind of rotating motor can only deliver torque, i.e. perform a rotating movement. However, in many applications a rotating and translating movement may be required. Usually, such rotating and translating movement is made by two motors, or by a specifically designed motor with complex electronics and control techniques.

U.S. Pat. No. 6,429,611 B1 discloses a combination rotary and linear motor which uses a modified brushless direct current (DC) motor. The motor comprises, among other things, a rotor, a motor casing, and three radially equi-spaced coils mounted to the interior cylindrical surface of the motor casing. An angular position $\theta$ of the rotor and a linear position z thereof along its rotation axis (z-axis) are controlled in accordance with command values $\theta c$ and zc, respectively. This is achieved by driving the coils accordingly. Currents Ia, Ib and Ic supplied to the coils are determined by means of a feedback loop comprising inter alia current sensors for sensing the currents Ia and Ib as well as proportional-integral (PI) controllers.

U.S. Pat. No. 6,429,611 B1 does not disclose a formula for the currents Ia, Ib and Ic supplied to the coils. The currents Ia and Ib are derived by means of a current feedback. Therefore, they have to be sensed by current sensors. Furthermore, PI controllers are needed to implement the feedback loop. These PI controllers are dynamic elements and have to be tuned to make them work. That is, the PI parameters have to be tuned. Thus, a certain amount of electronic and/or software components is needed to operate the combination rotary and linear motor described in U.S. Pat. No. 6,429,611 B1.

EP 2412086 discloses a device for enabling a rotating and translating movement by means of a single motor—a so called "N-forcer motor". The device comprises an ironless electric motor for linear and rotary movement can comprise a stator having a multi-phase coil arrangement including a number of coils or coil sets and a rotor being movable along a direction of its rotational axis and having a number of poles respectively comprising at least one permanent magnet. A control unit may determine currents based on at least the number of coils or coil sets, an angle of rotation of the rotor and a parameter depending on an axial position of the rotor, and supply the determined currents to the coils or coil sets.

Conventionally, semiconductor devices are manufactured on and in a circular plane substrate, also referred to as a wafer, in a matrix having a plurality of rows and columns of such circuits, which usually are all identical and usually all have the same dimensions, although these are no prerequisites. After the wafer production, a surface of the wafer is adhered to a flexible carrier film. The respective circuits are then physically separated from each other by cutting through the wafer from one surface to the opposite surface without cutting through the carrier film. Thus, a plurality of individual semiconductor devices, or circuits, (hereinafter also to be referred to as "chips" or "dies") arranged on the carrier film is obtained.

In a typical chip transfer apparatus, a chip transfer unit and a chip flip unit are used to pick up a semiconductor chip from a semiconductor wafer, to flip the orientation of the semiconductor chip, and to place the semiconductor chip at a target position, e.g. on to a carrier structure. For example, the chip transfer unit can be used to pick up an integrated circuit (IC) die from a wafer and transfer the IC die onto the chip flip unit, which is typically placed between the chip transfer unit and the target position. The chip flip unit can be used to flip the orientation of the IC die and to place the flipped IC die at the target position. For example, a wafer is usually positioned with the active side (also referred to as the bumped side, top side, or front side) facing the chip transfer and chip flip units. The chip transfer unit picks up the IC die on the bumped side while the chip flip unit flips the IC die such that the bumped side is down and places the flipped IC die at the target position with the bumped side facing downward.

Each chip is mechanically picked up and disengaged from the carrier film by a needle mechanism interacting with a transfer head of the chip transfer unit, the transfer head being in a chip pick-up position. Prior to each chip pick-up process, the chip is taken to the chip pick-up position by moving the wafer. After pick-up, the chip is transferred by the transfer head to a lead frame where the chip is released from the transfer head and fixedly mounted (bonded) on the lead frame, the transfer head being in a chip bonding position. Next, contact pads of each chip are electrically connected to contact pins of the lead frame in a wire bonding process. In other processes, where the chip is to be transferred, the chip, after pick-up, is transferred by the transfer head to a carrier tape, or to a chip flip unit (when the chip is to be flipped).

Typically, a chip transfer unit of a chip transfer apparatus comprises a rotary head with a number of transfer heads located thereon. Each transfer head comprises a collet, or vacuum pipette, operative to pick up a chip by vacuum. Thus, a transfer head of the rotary head can pick-up a chip from the wafer while another transfer head of the rotary head is placing a chip at a target position, e.g. on a carrier structure. It will be appreciated that during a transfer process, a chip will be handed over twice, i.e. at pick-up from wafer to transfer head and at placement from transfer head to the target position, e.g. a carrier structure such as a lead-frame or carrier tape.

In a so-called "flip-chip" arrangement, a second chip transfer unit is provided (i.e. a chip flip unit). Thus, a transfer head of the chip transfer unit can pick-up a chip from the wafer. The chip is transferred to a handover position, i.e. where the chip is passed to a transfer head of the chip flip unit, by rotating the rotary head so that the chip-carrying transfer head is moved from the pick-up position to the handover position. At the handover position, the chip is passed to a transfer head of the chip flip unit. The chip flip unit may then operate to move the chip to another location, e.g. so as to be positioned at a target position. It will be appreciated that, in a flip-chip transfer process, an additional handover, i.e. from the first chip transfer unit to the chip flip unit, is required. Thus, there are three handovers, which comprise: pick-up from wafer to transfer head; handover from the transfer head of the chip transfer unit to the transfer head of the chip flip unit; and placement from the transfer head of the chip flip unit to the target position.

Whilst a device comprising an ironless electric motor for linear and rotary movement as described above may be satisfactory, and may continue to be satisfactory for certain operating conditions, the inventors have recognised that including a back iron in a single electric motor may be advantageous for enhancing N-forcer motor performance in equipment where high speeds of operation may be required, e.g. such as "pick-and-place" type apparatus, or chip transfer apparatus, as described above. The inventors have recognised that provision of a back iron in the motor may increase the magnetic flux density and related forces T, Fz (for effecting linear and rotational movements) so that, for the same input power, a higher force and torque will be produced by such a motor, which is beneficial for space constrained applications and/or to achieve higher productivity/speeds.

The present disclosure has been devised with the foregoing in mind.

SUMMARY

According to an aspect of the present disclosure, there is provided a device comprising: a single electric motor for linear and rotary movement comprising: a stator, said stator comprising a multi-phase coil arrangement and comprising a plurality of coils or coil sets; and a rotor, said rotor movable in an axial direction of a rotational axis thereof and comprising a plurality of poles respectively comprising at least one permanent magnet; and a control unit operative to determine currents (Ir, Is, It) by means of calculation formulas and based on at least a number of coils or coil sets of said plurality of coils or coil sets, an angle of rotation of said rotor and a parameter depending on an axial position of said rotor, wherein each current (Ir, Is, It) comprises a current component (IrΦ, IsΦ, ItΦ) for generating a torque and a current component (Irx, Isx, Itx) for generating an axial force, and to supply said determined currents in open loop to said number of coils or coil sets, wherein the sum of the currents is zero, and further wherein at least one of: said stator; and said rotor, comprises a back-iron.

The provision of a back iron in the single electric motor of the device provides a more efficient motor than one without a back iron and which, for the same input power, can produce a higher force and torque. This may be beneficial for space constrained applications and/or to achieve higher productivity/speeds. This may, when the device is used in a chip transferring apparatus, provide a relatively fast chip transferring apparatus, or flip-chip transferring apparatus, for chips.

Optionally, said single electric motor may comprise one of: an outer rotor topology; and an inner rotor topology.

Optionally, the device may comprise: a first sensor configured to sense said angle of rotation and supply it to said control unit; and a second sensor configured to sense said axial position of said rotor and supply it to said control unit.

Optionally, the device may comprise a bearing system configured to bear said rotor and constrain all degrees of freedom except for a linear degree of freedom along said rotational axis and a rotational degree of freedom around said rotational axis.

Optionally, said bearing system may comprise an active magnetic bearing system.

Optionally, said parameter changes may be inversely proportional as a function of said axial position.

Optionally, said control unit may be configured to determine said currents based also on a further parameter that is independent of said axial position.

Optionally, said control unit may be configured to determine a current for: a first coil or coil set as: $I_r=I_{r\Phi}+I_{rx}=A \sin(n(\Phi-\theta))+B \cos(n(\Phi-\theta))$; a current for a second coil or coil set as: $I_s=I_{s\Phi}+I_{sx}=A \sin(n(\Phi-\theta)-(2\pi/3\pi))+B \cos(n(\Phi-\theta)-(2\pi/3n))$; and a current for a third coil or coil set as: $I_t=-I_r-I_s=I_{t\Phi}+I_{tx}=A \sin(n(\Phi-\theta)+(2\pi/3n))+B \cos(n(\Phi-\theta)+(2\pi/3n))$, wherein A is said parameter depending on said axial position, n is a number of magnet pole pairs, $\Phi$ is said angle of rotation, $\theta$ is an alignment angle between 0 and $2\pi/n$, and B is a further parameter.

Optionally, said electric motor may be a direct current electric motor.

According to another aspect of the present disclosure, there is provided an apparatus for transferring a semiconductor device from a wafer to a target position, comprising: a device as described above and hereinafter; and a rotatable transfer assembly comprising a transfer head rotatable about an axis of rotation of said rotatable transfer assembly to transfer a semiconductor device from a pick-up position to a transfer position and moveable in an axial direction relative to a plane of rotation of said transfer head; wherein rotation and/or axial movement of said transfer head is implemented by said device.

Optionally, said rotatable transfer assembly is operative to: rotate said transfer head thereof to said pick-up position; and rotate said transfer head to said transfer position.

Optionally, said transfer position comprises said target position; and/or optionally, wherein said target position comprises a position where said semiconductor device is located for placement on a carrier structure; and/or optionally, wherein said target position comprises a position where the semiconductor device is located for placement on a carrier tape; or optionally, wherein said target position comprises a position where the semiconductor device is located for placement on a leadframe.

Optionally, said rotatable transfer assembly may be moveable in said axial direction simultaneously with transfer of said semiconductor device at said transfer position.

According to a further aspect of the present disclosure, there is provided an apparatus for aligning a substrate, comprising: a device as described above and hereinafter; a substrate conveying apparatus operative to convey said substrate in a transport direction for processing of said substrate in a processing location; a substrate position detector operative to detect a position of an indexing element on said substrate; a misalignment detector operative to determine if a detected position of said indexing element is coincident with a desired position in said processing location at which processing can occur; and wherein, responsive to determination of a misalignment between said detected position and said desired position, said device is operative to adjust a position of said substrate in said transport direction and/or in a direction lateral to said transport direction so that said position of said indexing element is coincident with said desired position.

DESCRIPTION OF THE DRAWINGS

One or more specific embodiments in accordance with aspects of the present disclosure will be described, by way of example only, and with reference to the following drawings in which.

DESCRIPTION

Figure 1:
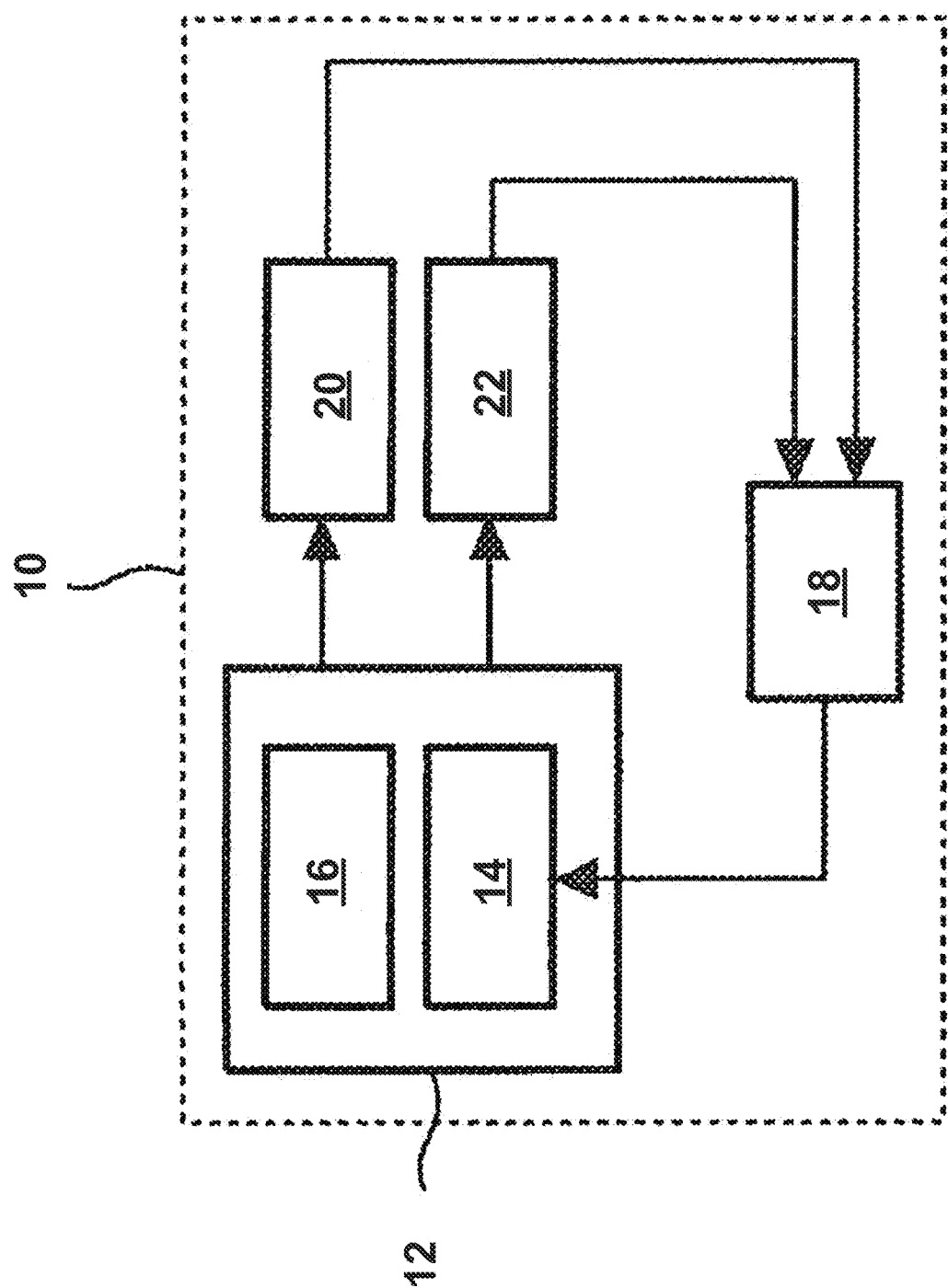
FIG. 1 shows a schematic block diagram illustrating an arrangement of a device according to one or more embodiments of the disclosure.

FIG. 1 shows a schematic block diagram illustrating an arrangement of a device 10 according to one or more embodiments. The device 10 can comprise an electric motor 12 including a stator 14 and a rotor 16, with a back iron disposed on at least one of said stator 14 and rotor 16, for example a substantially cogging free electric motor such as e.g. a direct current (DC) motor. The stator 14 may comprise a multiple of three coils (3, 6, 9, . . . ). The rotor 16 can be a permanent magnet rotor. The electric motor 12 comprises a rotating motor.

The device 10 can further comprise a control unit 18, a first sensor 20 and a second sensor 22. The control unit 18 may determine currents to be supplied to coils or coil sets of the stator 14. The first sensor 20 can sense an angle of rotation of the rotor 16. The second sensor 22 may sense an axial position or displacement of the rotor 16.

Figure 2:
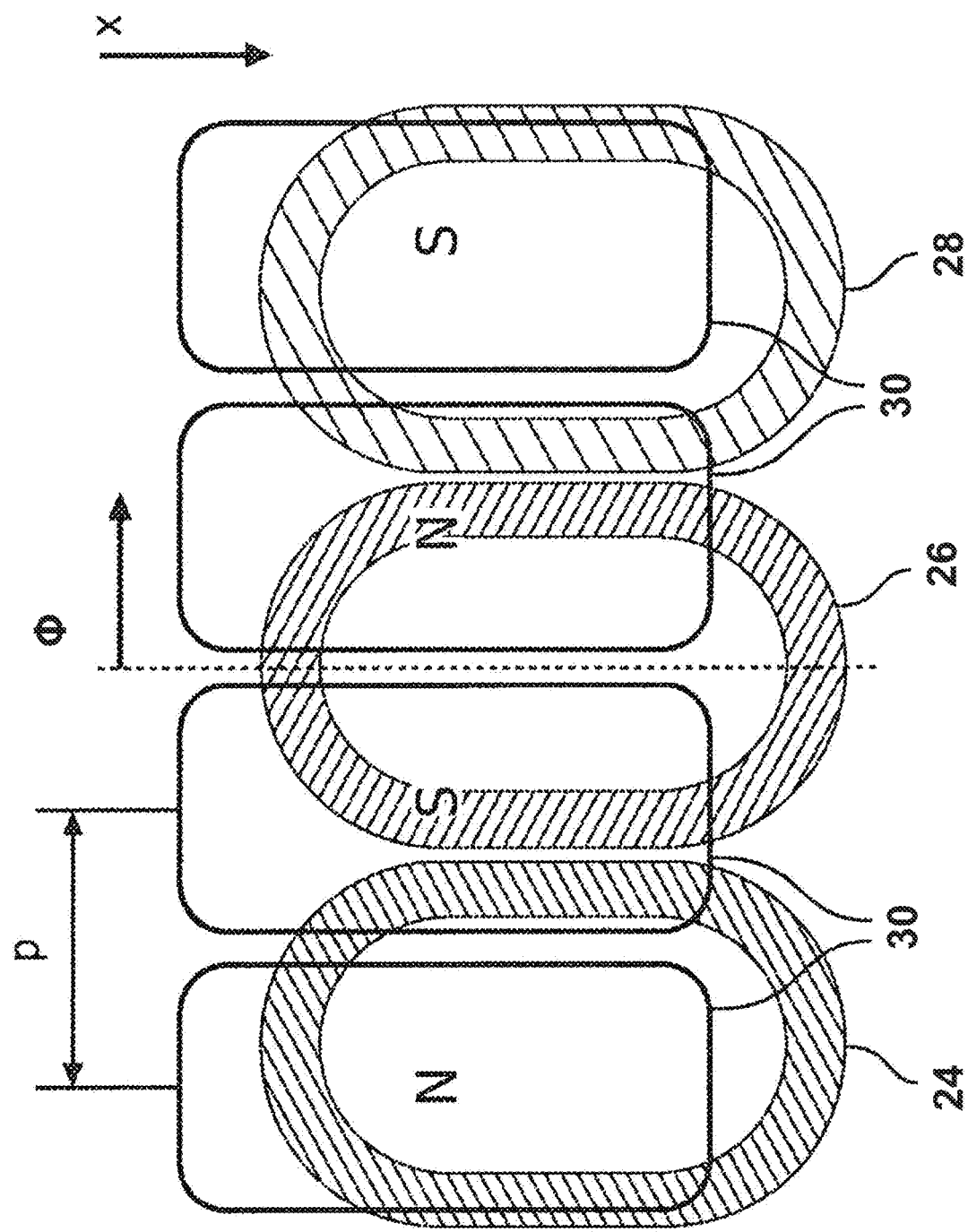
FIG. 2 shows a schematic diagram illustrating a configuration of coils and poles in the device.

FIG. 2 shows a schematic diagram illustrating a configuration of coils and poles in the exemplary device 10. Such depiction can be obtained by cutting up the electric motor 12 on one side along the axis and folding it open. The stator 14 may have a multiphase coil arrangement including a number of coils or coil sets. In the exemplary device 10 the stator 14 can comprise a first coil or coil set 24, a second coil or coil set 26 and a third coil or coil set 28. While single first to third coils 24, 26 and 28 are shown in FIG. 2, there may also be respective coil sets. As the electric motor 12 of the exemplary device 10 can be a three-phase motor, there may be a multiple of three coils.

The rotor 16 can have a number of poles 30. These poles 30 may respectively comprise at least one permanent magnet. In the configuration illustrated in FIG. 2, there are four poles respectively comprising a permanent magnet. A double-headed arrow denoted by p indicates a pitch between the poles 30, i.e. a magnet pitch. It can be expressed as $p=\pi/n$, wherein n may indicate a number of magnet pole pairs. An arrow denoted by $\Phi$ indicates an angle of rotation of the rotor 16 in radians (rads), i.e. an angular position of the rotor 16 or displacement along the circumference. An arrow denoted by x indicates a displacement of the rotor 16 along a rotational axis thereof and also indicates a direction of the rotational axis.

Figure 3:
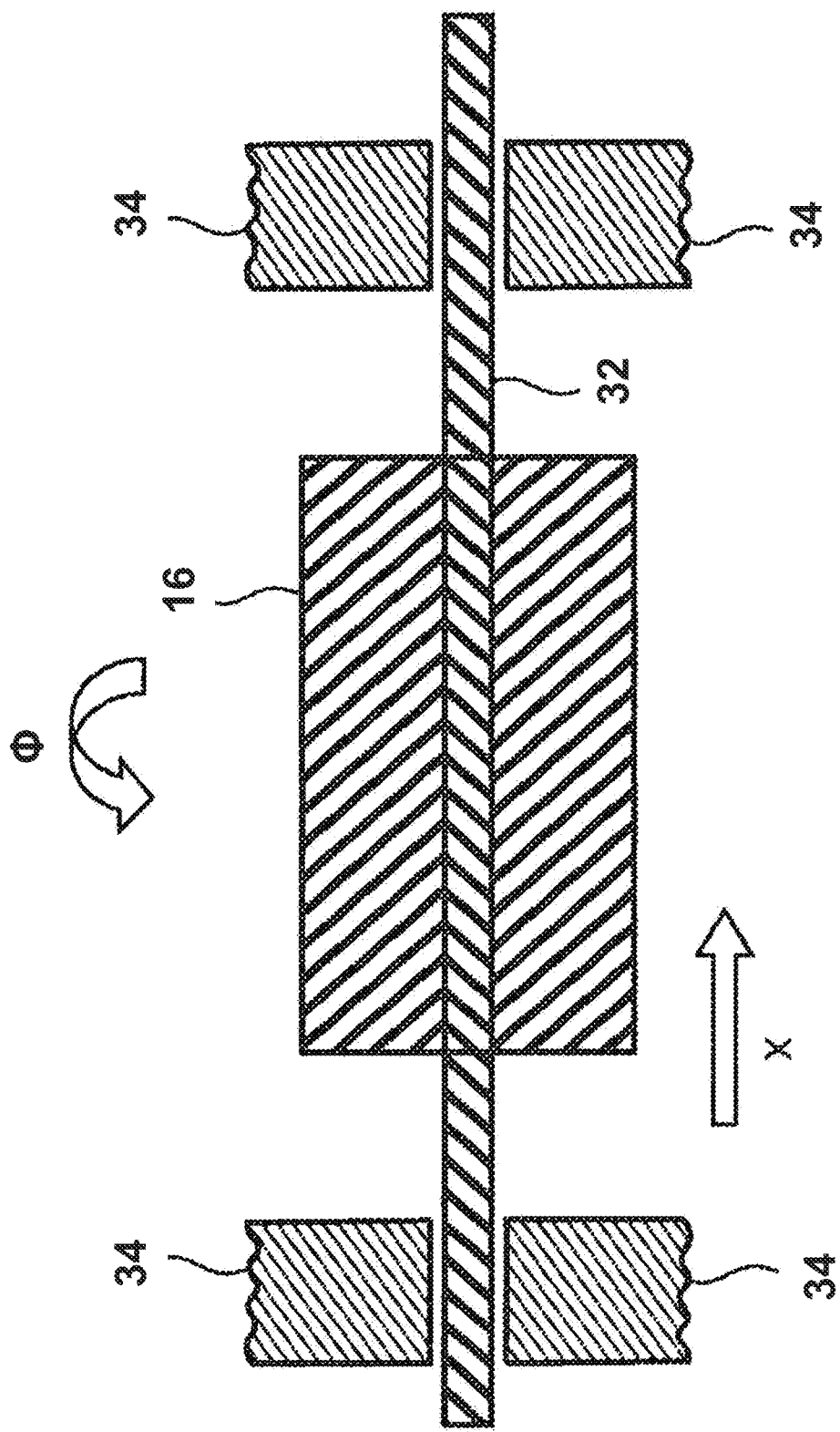
FIG. 3 shows a schematic cross section of a bearing system and a rotor in the device.

FIG. 3 shows a schematic cross section of a bearing system 34 and the rotor 16 in the exemplary device 10. The rotor 16 can rotate around a rotational axis 32. The rotor 16 may be borne by the bearing system 34, i.e. the rotational axis 32 thereof can be guided or borne by the bearing system 34. The bearing system 34 may constrain all degrees of freedom except for a linear degree of freedom along the rotational axis 32 and a rotational degree of freedom around the rotational axis 32. The bearing system 34 can be e.g. an active magnetic bearing system.

Figure 4:
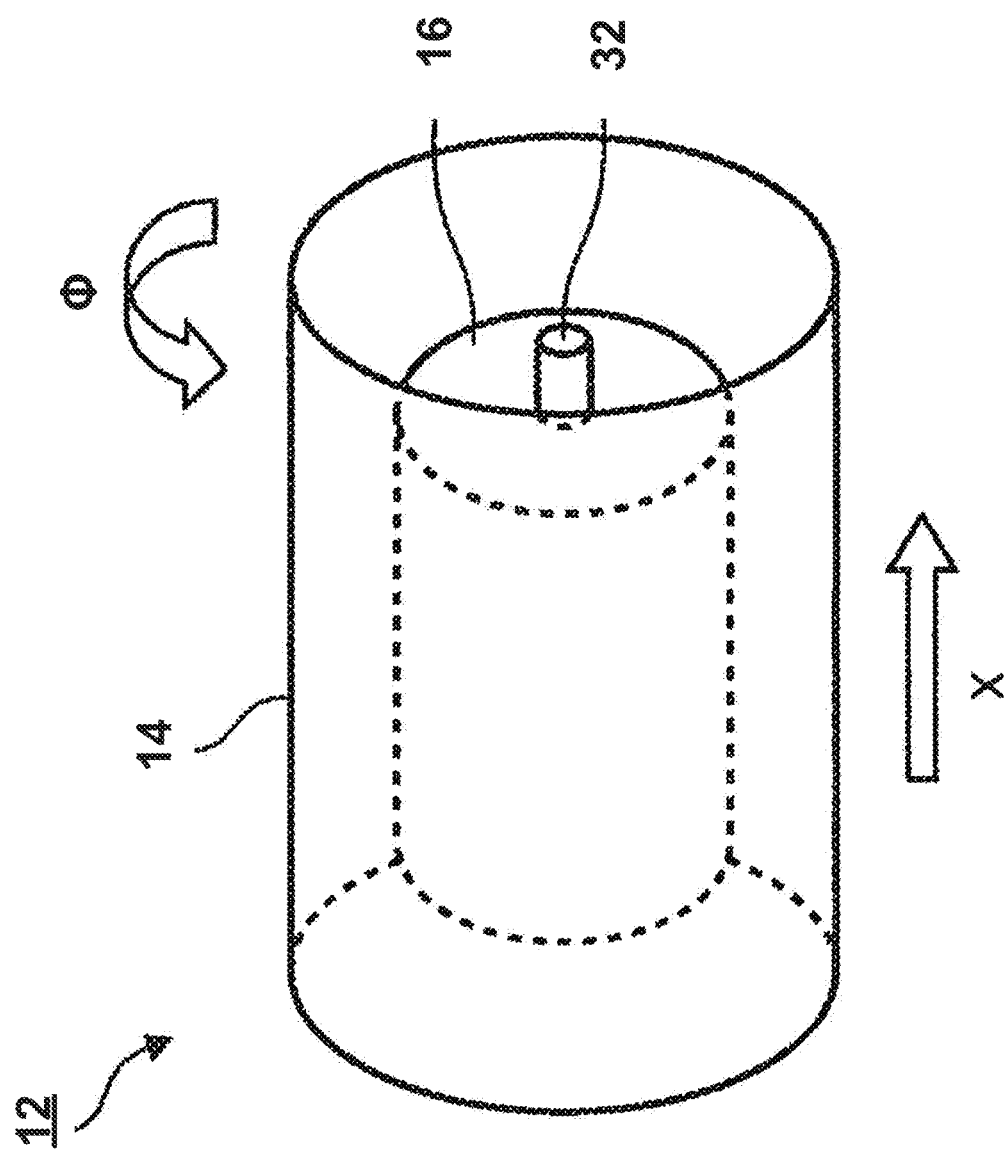
FIG. 4 shows a schematic diagram of an electric motor in the device in a first operating state.

FIG. 4 shows a schematic diagram of the electric motor 12 in the exemplary device 10 in a first operating state. As illustrated in FIG. 4, the rotor 16 may be positioned in the centre of the coils of the stator 14, usually a multiple of three (3, 6, 9, . . . ). The end effects of these coils can balance out in this way.

Figure 5:
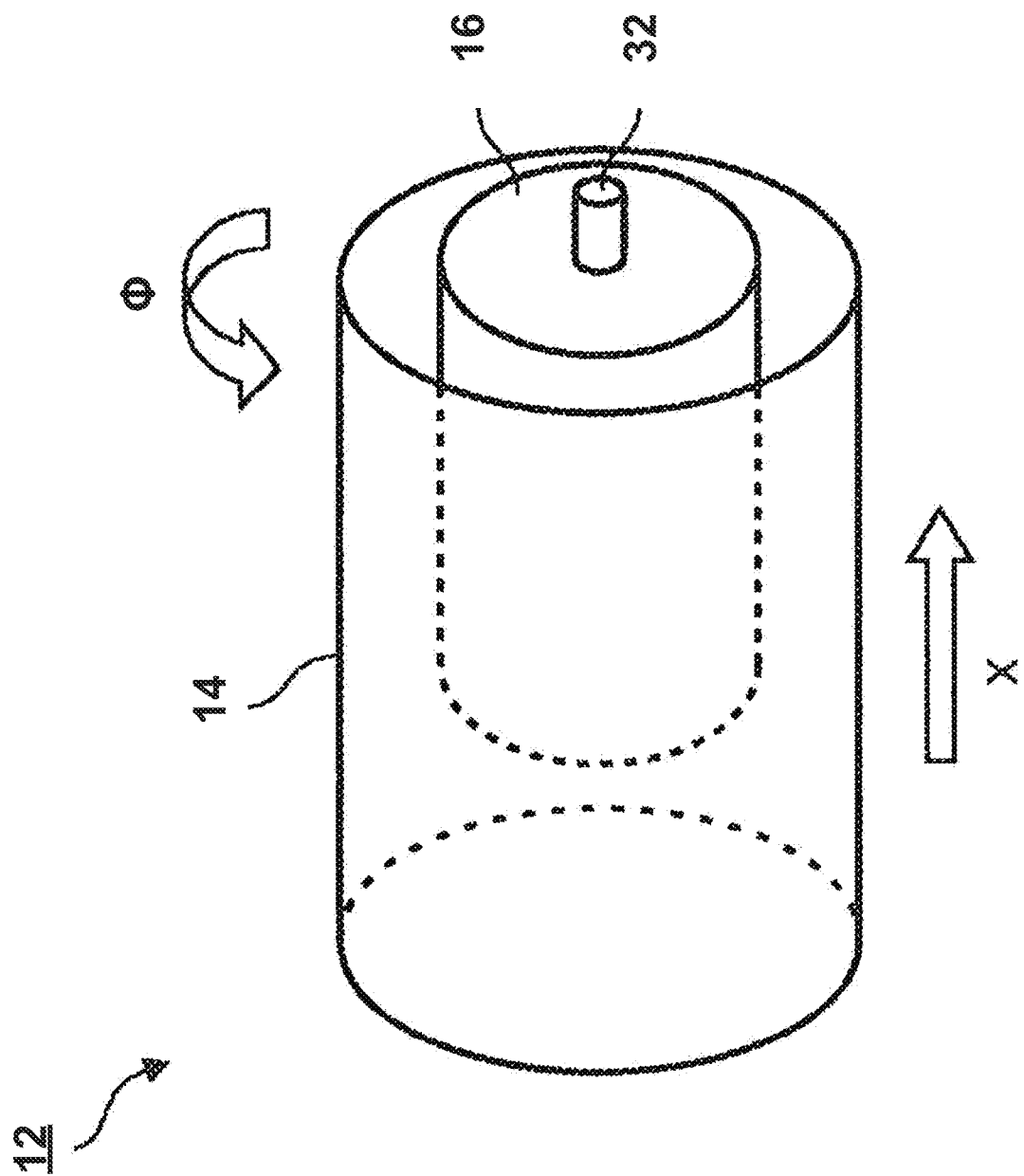
FIG. 5 shows a schematic diagram of an electric motor in the device in a second operating state.

FIG. 5 shows a schematic diagram of the electric motor 12 in the exemplary device 10 in a second operating state. As illustrated in FIG. 5, the rotor 16 can be shifted along the rotational axis 32. As a result, the end effects of the coils may not balance out any more, but increase. For a normal rotating motion and/or a torque, three correlated currents can be applied to the appropriate coils. By applying a different set of correlated currents, an axial force due to the end effects of the coils may become dominant. That is, the position shift of the rotor 16 enables to exert an x-force such as e.g. a restoring force. Thus, the torque and the axial force may be controlled substantially independent of each other. This is described in more detail below.

As mentioned above, there may be three coils (or a multiple of three coils) 24, 26 and 28 in the electric motor 12 or another three-phase motor. A current for each of the three coils or coil sets 24, 26 and 28 can be derived from a position of the rotor 16. That is, currents to be supplied to the coils or coil sets 24, 26 and 28 may be determined by the control unit 18 based on an angle of rotation of the rotor 16. The angle of rotation of the rotor 16 can be sensed by the first sensor 20.

A current for the first coil or coil set 24 may be denoted by Ir. A current for the second coil or coil set 26 can be denoted by Is. A current for the third coil or coil set 28 may be denoted by It. Each of these currents Ir, Is and It can comprise two respective portions or components. That is, the currents Ir, Is and It may be determined or calculated according to the following equations:

$$I_r = I_{r\Phi} + I_{rx} \quad (1)$$

$$I_s = I_{s\Phi} + I_{sx} \quad (2)$$

$$I_t = I_{t\Phi} + I_{tx} \quad (3)$$

IrΦ, IsΦ and ItΦ can be current components for generating a torque, i.e. a force FΦ in Φ direction, and Irx, Isx and Itx may be current components for generating an axial force, i.e. a force Fx in x direction. These components can be determined or calculated according to the following equations:

$$I_{r\Phi} = A \sin(n(\Phi - \theta)) \quad (4)$$

$$I_{s\Phi} = A \sin(n(\Phi - \theta) - 2\pi/3n) \quad (5)$$

$$I_{t\Phi} = -I_{r\Phi} - I_{s\Phi} = A \sin(n(\Phi - \theta) + 2\pi/3n) \quad (6)$$

$$I_{rx} = B \cos(n(\Phi - \theta)) \quad (7)$$

$$I_{sx} = B \cos(n(\Phi - \theta) - 2\pi/3n) \quad (8)$$

$$I_{tx} = -I_{rx} - I_{sx} = B \cos(n(\Phi - \theta) + 2\pi/3n) \quad (9)$$

In the above equations, A may be a parameter that can be dependent on the axial position x of the rotor 16 and a required torque, and independent of the angle of rotation of the rotor 16. That is, $I_{r\Phi} = A(x)\sin(n(\Phi - \theta))$, $I_{s\Phi} = A(x)\sin(n(\Phi - \theta) - 2\pi/3n)$ and $I_{t\Phi} = A(x)\sin(n(\Phi - \theta) + 2\pi/3n)$ may apply. The axial position of the rotor 16 can be sensed by the second sensor 22.

The value n may indicate a number of magnet pole pairs. The value Φ can indicate the angle of rotation of the rotor 16 in radians (rads), i.e. the angular position of the rotor 16 or displacement along the circumference. The value θ may indicate an alignment angle aligning a commutation angle with a magnetic angle of a magnetic field in a magnetic track of the electric motor 12. The alignment angle can take a value between 0 and 2π/n. B may be a further parameter that can be independent of both the axial position of the rotor 16 and the angle of rotation thereof, and dependent on a required force.

As apparent from the equations (4) to (6), the relation between the currents may be a phase shift of two times the magnet pitch p divided by three times the number n of magnet pole pairs. After an alignment procedure, Φ is said to be zero at a point where FΦ is a maximum. In this situation, Fx can be zero. If the relation between angular position and current is shifted over 2*p/(n*4), currents as calculated according to the equations (7) to (9) may be obtained. In this situation, FΦ can be zero and Fx may be a maximum.

The current sets defined by the equations (4) to (6) on the one hand and by the equations (7) to (9) on the other hand can be added (sines and cosines). The result may be a mix between $F_\Phi$ and $F_x$. For example, a resultant force F can be determined or calculated according to the following equation:

$$F = CF_\Phi + DF_x = CF_\Phi(I_{r\Phi}, I_{s\Phi}, I_{t\Phi}) + DF_x(I_{rx}, I_{sx}, I_{tx}) \quad (10)$$

$F_\Phi$ and $F_x$ may be controlled substantially independent of each other. Thus, the electric motor 12 can deliver not only a torque but also a force along its axis, wherein the torque and the axial force may be set independently of each other. An additional commutation can be provided for that purpose.

Figure 6:
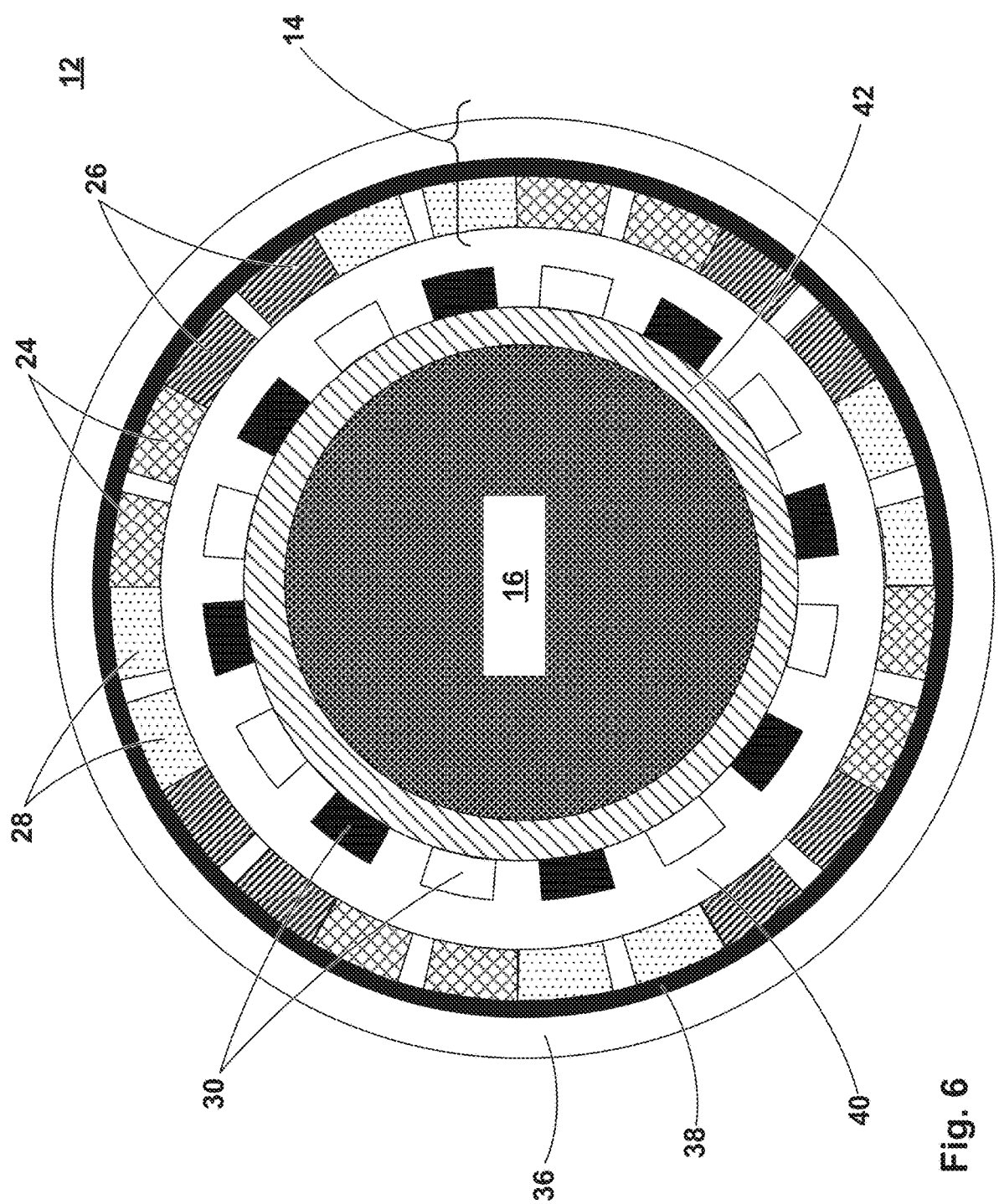
FIG. 6 shows a schematic diagram of a cross-section of an electric motor of the device where the electric motor comprises an inner rotor topology with rotor back iron.
Figure 7:
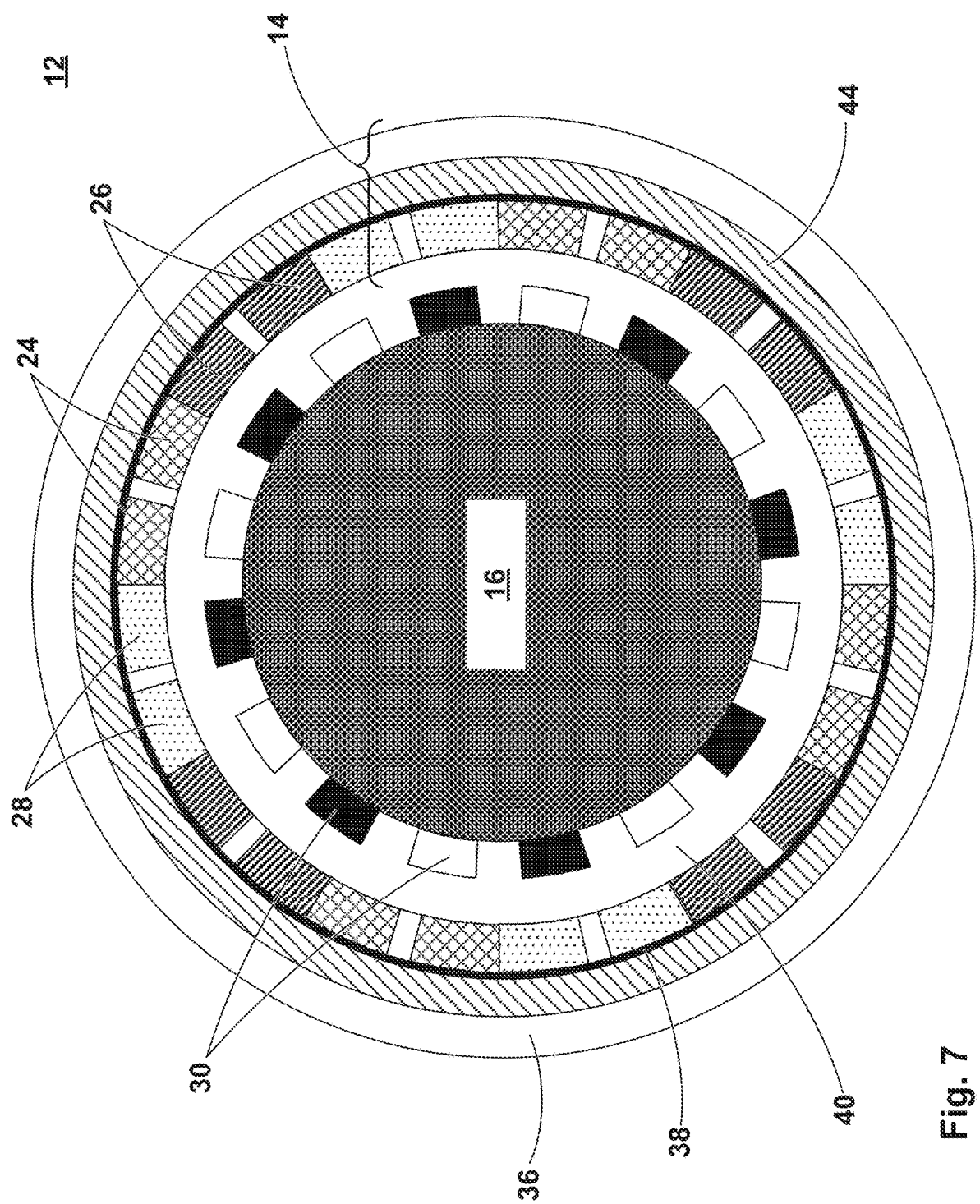
FIG. 7 shows a schematic diagram of a cross-section of an electric motor of the device where the electric motor comprises an inner rotor topology with stator back iron.
Figure 8:
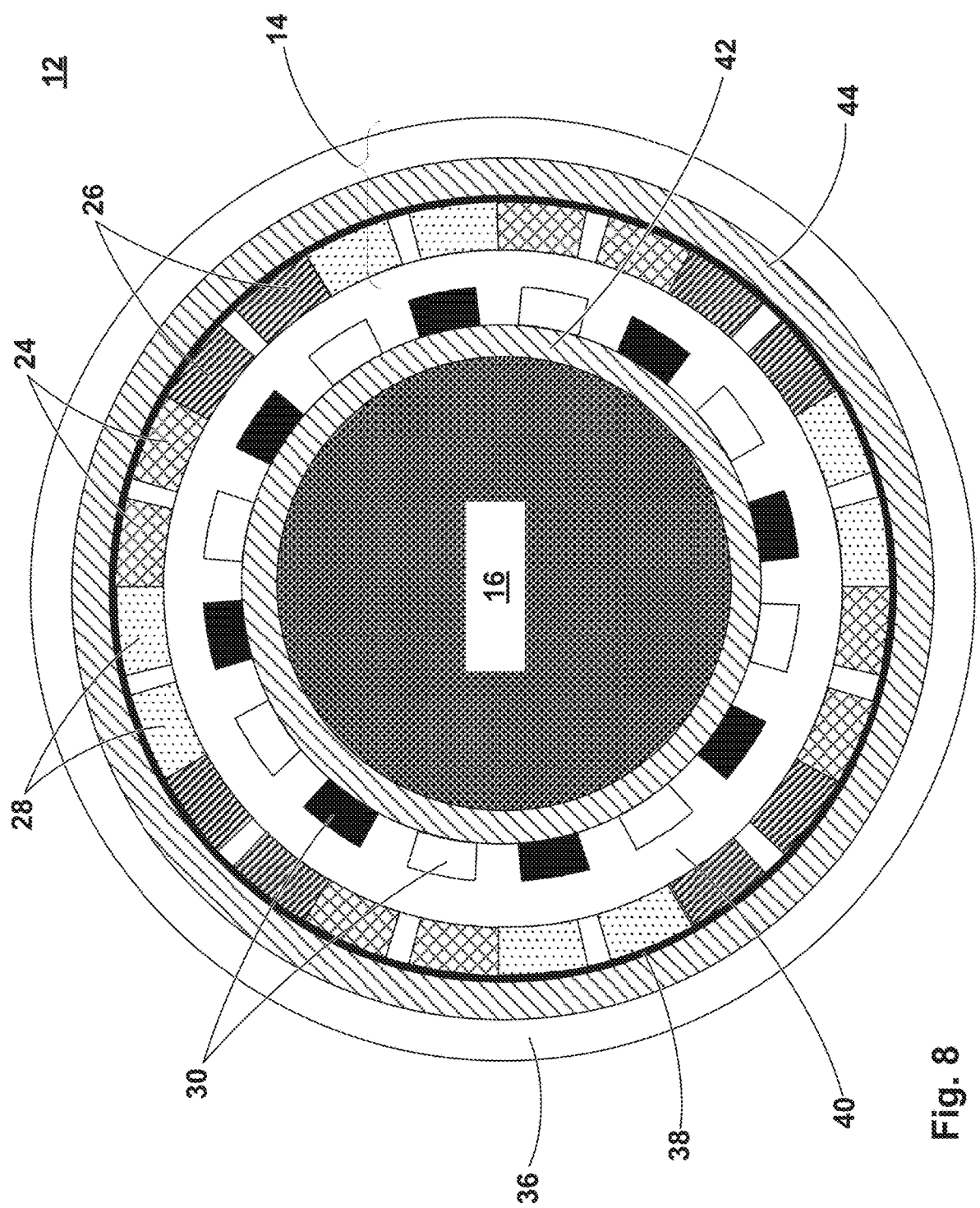
FIG. 8 shows a schematic diagram of a cross-section of an electric motor of the device where the electric motor comprises an inner rotor topology with rotor back iron and stator back iron.
Figure 9:
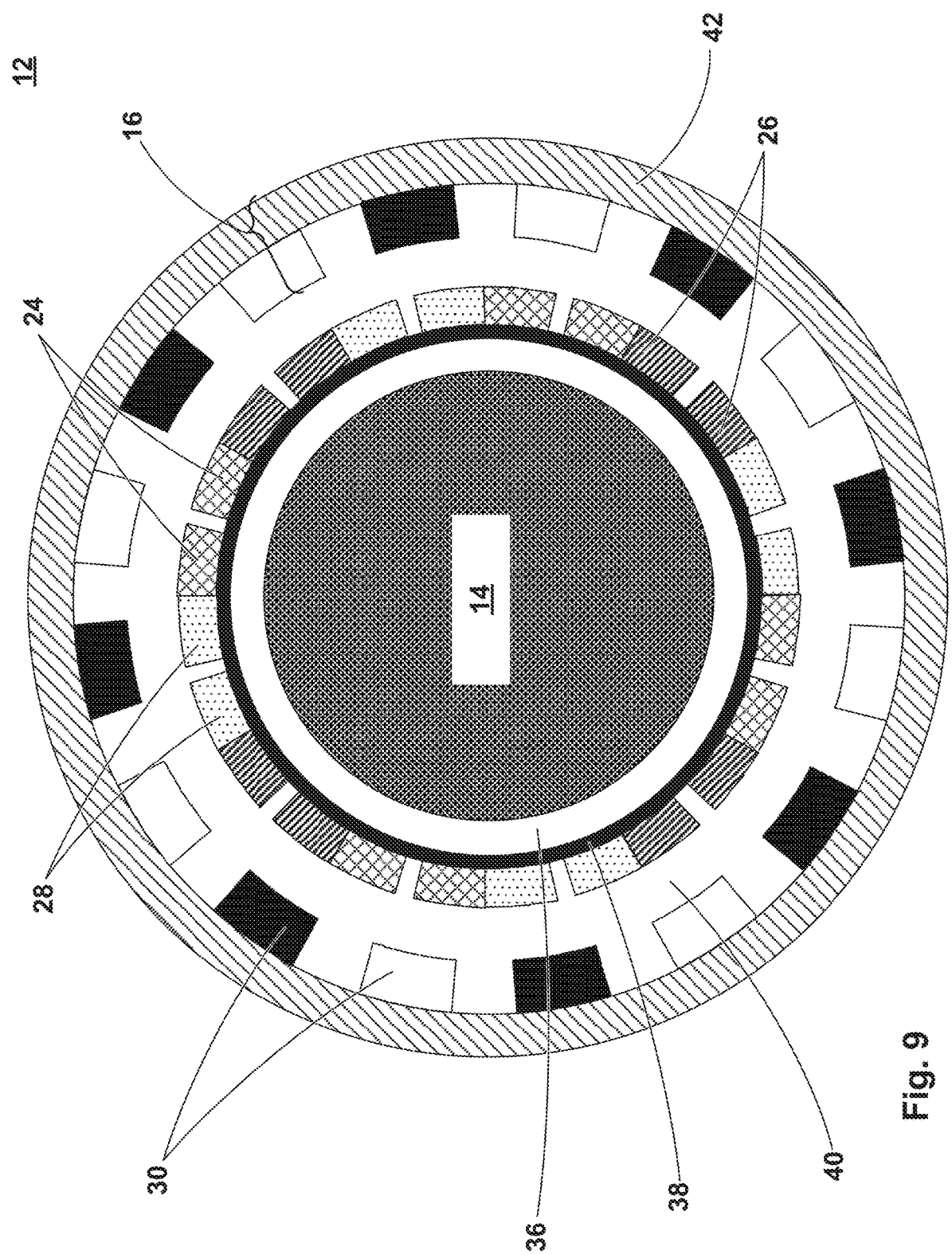
FIG. 9 shows a schematic diagram of a cross-section of an electric motor of the device where the electric motor comprises an outer rotor topology with rotor back iron.
Figure 10:
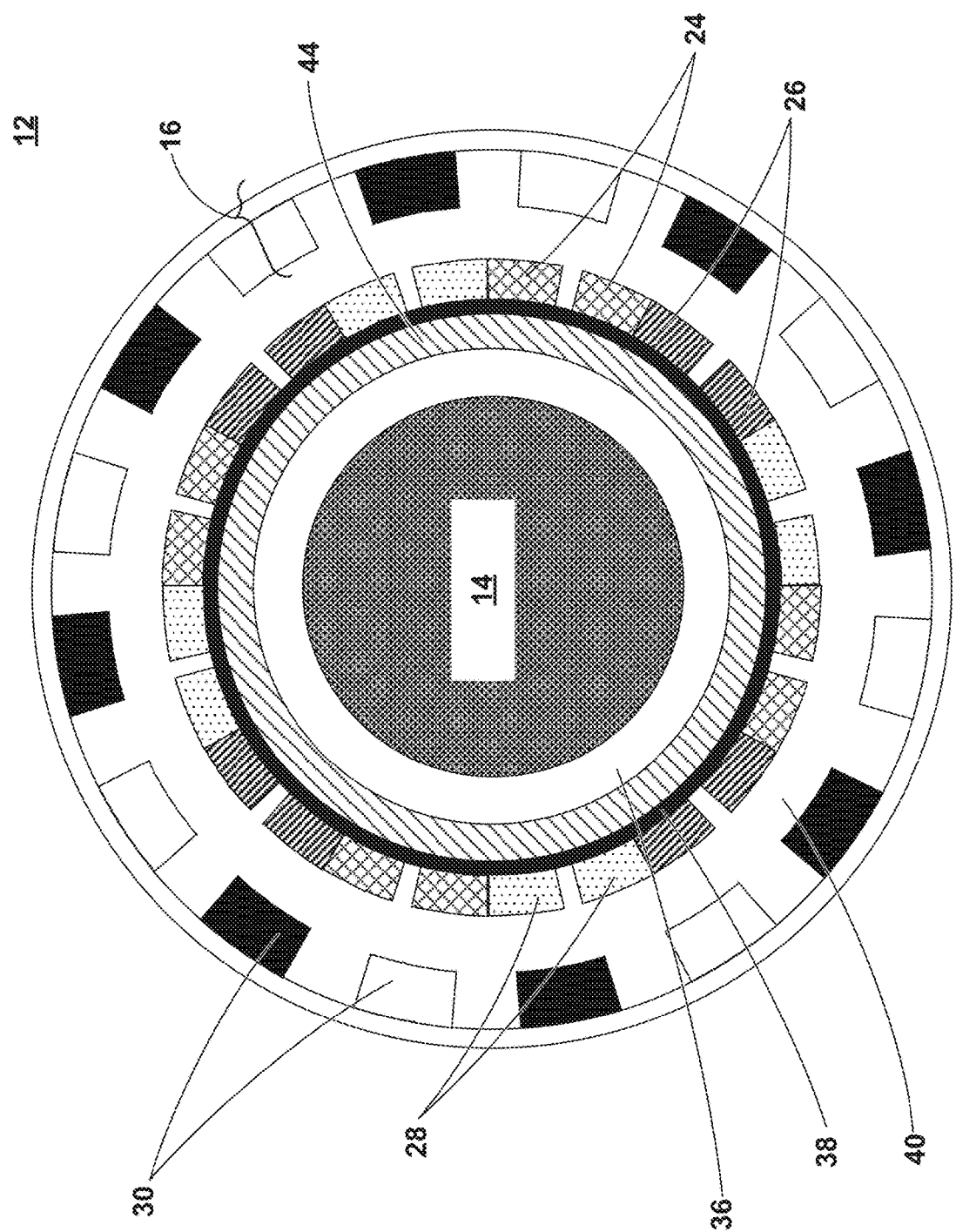
FIG. 10 shows a schematic diagram of a cross-section of an electric motor of the device where the electric motor comprises an outer rotor topology with stator back iron.
Figure 11:
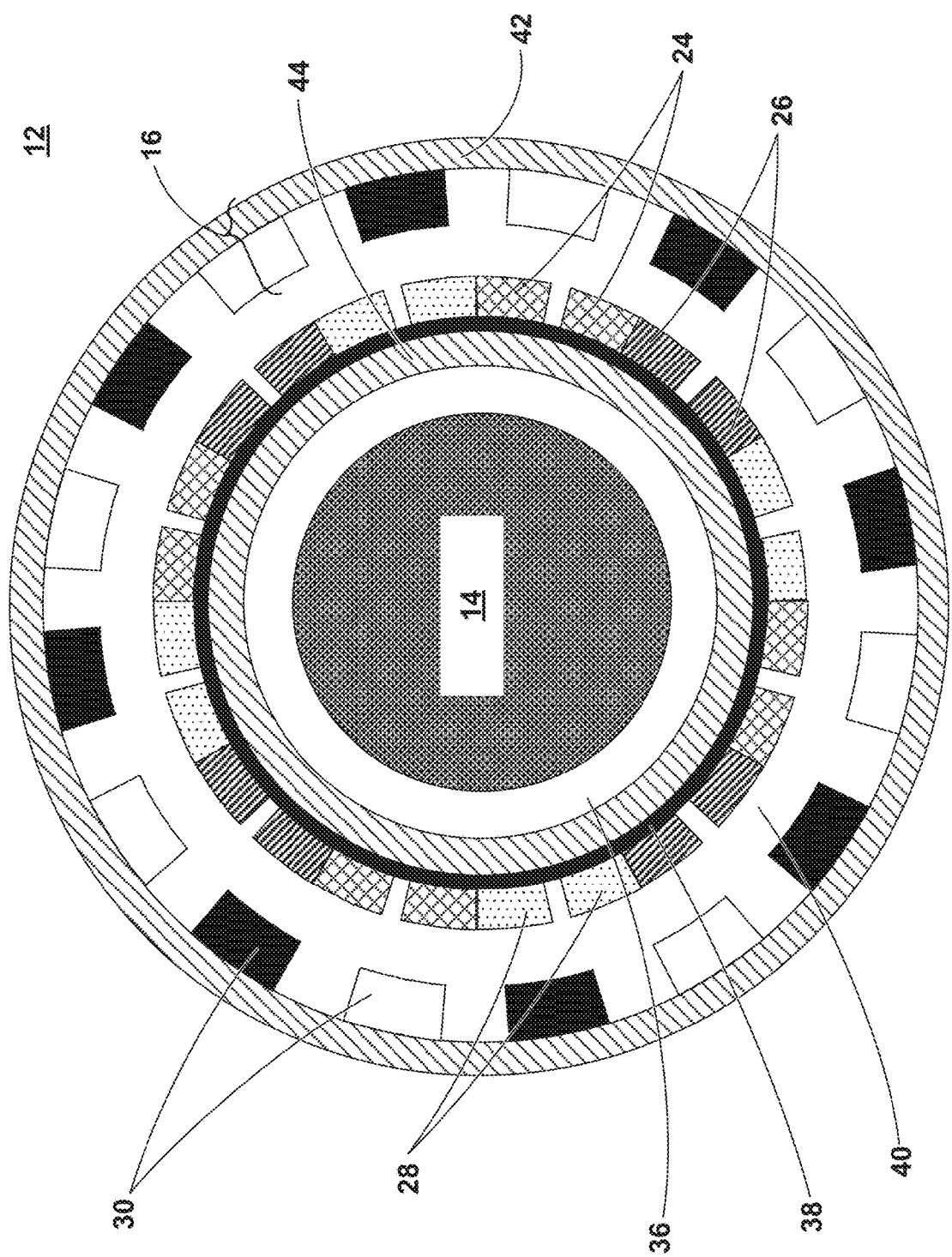
FIG. 11 shows a schematic diagram of a cross-section of an electric motor of the device where the electric motor comprises an outer rotor topology with rotor back iron and stator back iron.

FIGS. 6 to 11 show schematic diagrams of cross-sections of an electric motor 12 of the device 10 where the electric motors 12 comprise different topologies. FIG. 6 shows a schematic diagram of a cross-section of an electric motor 12 of the device 10 where the electric motor 12 comprises an inner rotor topology with rotor back iron 42. FIG. 7 shows a schematic diagram of a cross-section of an electric motor 12 of the device 10 where the electric motor 12 comprises an inner rotor topology with stator back iron 44. FIG. 8 shows a schematic diagram of a cross-section of an electric motor 12 of the device 10 where the electric motor 12 comprises an inner rotor topology with rotor back iron 42 and stator back iron 44. FIG. 9 shows a schematic diagram of a cross-section of an electric motor 12 of the device 10 where the electric motor 12 comprises an outer rotor topology with rotor back iron 42. FIG. 10 shows a schematic diagram of a cross-section of an electric motor 12 of the device 10 where the electric motor 12 comprises an outer rotor topology with stator back iron 44. FIG. 11 shows a schematic diagram of a cross-section of an electric motor 12 of the device 10 where the electric motor 12 comprises an outer rotor topology with rotor back iron 42 and stator back iron 44.

In the electric motors 12 illustrated in FIGS. 6 to 11, the electric motors 12 comprise a cooling system 36, insulation layer 38, and an air gap 40 between the stator 14 and the rotor 16.

The stator 14 of the motor 12 comprises coils 24, 26, 28 attached via the insulation layer 38, either to the stator back iron 44, which itself is attached to the cooling system 36 (if stator back iron is present), or attached via the insulation layer 38 to the cooling system 36 (if the stator back iron is not present).

The rotor 16 of the motor 12 comprises a shaft to which magnets of alternating polarity are attached: to an outer surface thereof (in an inner rotor topology); or to an inner surface thereof (in an outer rotor topology). Where a rotor back iron 42 is present, the magnets are attached to the rotor back iron 42. Optionally, both curved and parallel magnetization of the magnets may be employed. Further optionally, magnet shape may be rectangular and/or curved. Yet further optionally, the magnets may comprise Neodymium Iron Boron magnets. Further optionally, a Halbach magnet array may be employed.

Optionally, a solid rotor back iron is employed.

Optionally, the cooling system may be a water-cooled system. Further optionally, material of the stator back iron 44 may comprise electrical laminated steel. Yet further optionally, the coils may be encapsulated and attached to the insulation layer. A multiphase winding may be employed for control purposes.

In the examples of inner rotor topologies (FIGS. 6 to 8), the rotor 16 comprises a rotatable shaft and the stator 14 comprises a shaft having a bore in which the rotor 16 is disposed. The stator 14 may be mounted relative to the rotor 16 with 2-degree-of-freedom bearings, or a combination of multiple 1-degree-of-freedom bearings (ball-bush and leaf-spring bearings, for example).

In the examples of outer rotor topologies (FIGS. 9 to 11), the rotor 16 comprises a rotatable shaft having a bore in which the stator 14 is disposed. Again, the stator 14 may be mounted relative to the rotor 16 with 2-degree-of-freedom bearings, or a combination of multiple 1-degree-of-freedom bearings (ball-bush and leaf-spring bearings, for example).

Figure 12:
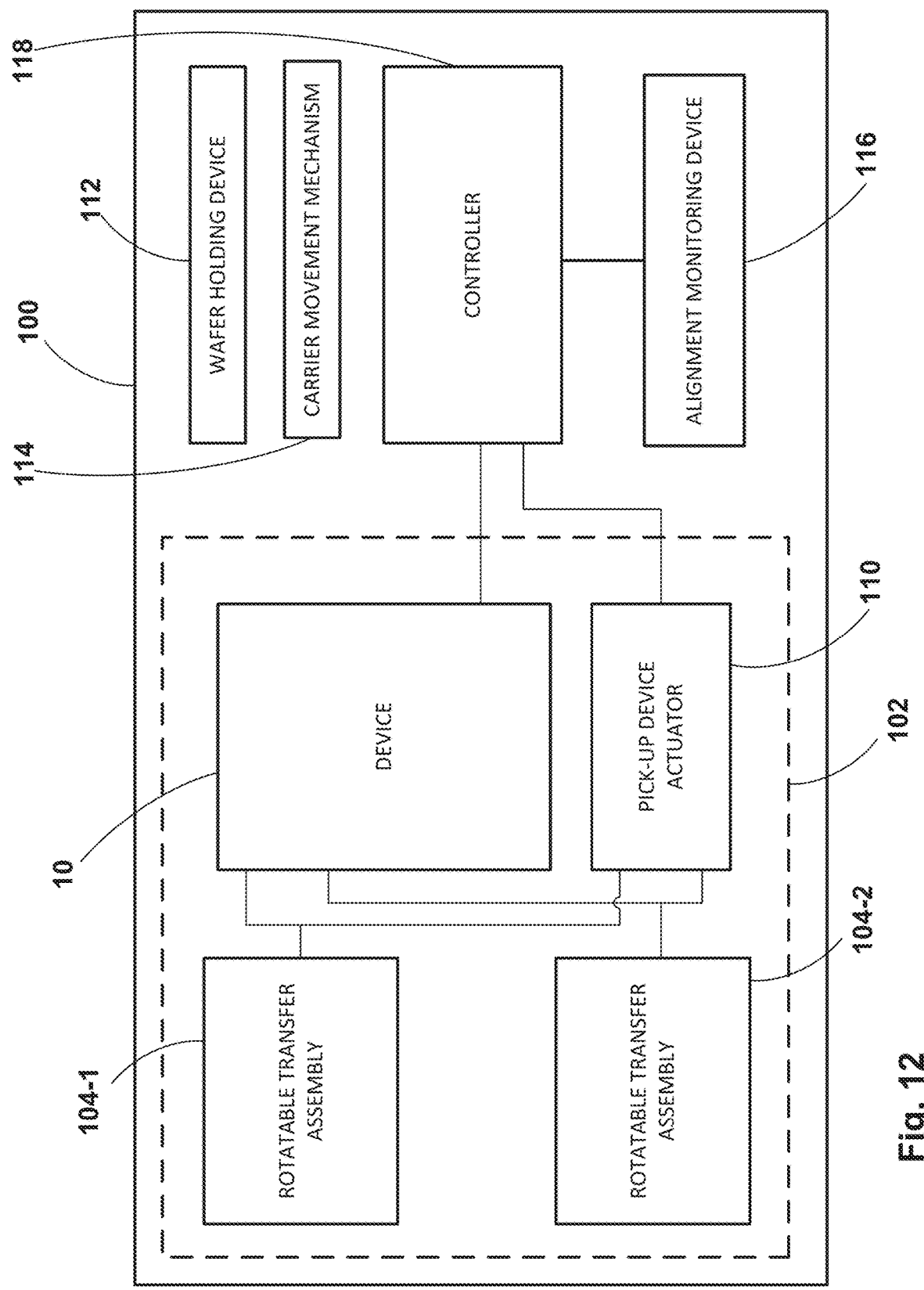
FIG. 12 illustrates a schematic block diagram of a system, incorporating an apparatus that comprises the device according to one or more embodiments of the present disclosure, the system for transferring a semiconductor device from a wafer to a target position.

FIG. 12 illustrates a schematic block diagram of a system 100 for transferring a semiconductor device from a wafer to a target position in accordance with one or more embodiments of the present disclosure. The target position may be at, or on, a carrier structure, such as a leadframe or a carrier tape. The system 100 includes an apparatus 102, a wafer holding device 112, a carrier movement mechanism 114, an alignment monitoring device 116, and a controller 118.

Apparatus 102 comprises two rotatable transfer assemblies 104-1, 104-2, the device 10, as described above, and a pick-up device actuator 110. The device 10 comprises a motor for effecting linear and rotational movement of the transfer assemblies, and the pick-up device actuator 110 comprises a driver device for effecting movement of pick-up parts of the two rotatable transfer assemblies. Both the device 10 and pick-up device actuator 110 effect movement responsive to receipt of control signals from the controller 118.

The system 100 can be used for semiconductor device packaging. For example, the system 100 can be used to transfer semiconductor devices from a wafer to a target position, e.g. a carrier structure, such as a lead frame or a carrier tape. Examples of semiconductor devices that can be transferred by the system 100 include, without being limited to, integrated circuit (IC) chips, IC dies and other IC modules. The size of an IC die can be in any suitable range. The rotatable transfer assemblies 104-1, 104-2 of apparatus 102 are used to transfer a semiconductor device from a wafer held by the wafer holding device 112 onto a surface of the carrier structure that is located at the carrier movement mechanism 114. Each of the rotatable transfer assemblies may have at least two transfer heads and each of the transfer heads is used to transfer one semiconductor device at one time. The rotatable transfer assemblies 104-1, 104-2 can pick up and hold, using pick-up devices thereon (e.g. collets), semiconductor devices by suction, by force or by other applicable means.

The device 10 and the pick-up device actuator 110 are operative to control the position of transfer heads of the rotatable transfer assemblies 104-1, 104-2. This positioning will be described in more detail in relation to FIG. 18.

The wafer holding device 112 of the system 100 is configured to hold a wafer, which includes a number of semiconductor devices (e.g., IC dies or chips fabricated thereon and semiconductor packages), in place for semiconductor device pick-up by at least one of the rotatable transfer assemblies 104-1, 104-2.

The carrier movement mechanism 114 of the system 100 is used to position or move a carrier structure (e.g., a lead frame or a carrier tape). The carrier movement mechanism 114 may have a channel through which a carrier structure is fed. The carrier structure may comprise a bond surface on which the semiconductor devices are placed. Examples of the carrier structure include, without being limited, lead frames and carrier tapes. The carrier movement mechanism 114 may be a moving platform (e.g., a conveyor system) such that the carrier structure can continuously change the position at which a semiconductor device is placed. Examples of the carrier movement mechanism are reel-to-reel lead-frame indexers, strip-to-strip indexers and reel-to-reel carrier tape indexers.

The alignment monitoring device 116 of the system 100 is configured to check an alignment of pick-up devices of the transfer heads of transfer assemblies 104-1, 104-2 during the transfer process from a wafer at the wafer holding device 112 to the carrier structure that is located at the carrier movement mechanism 114. The alignment monitoring device 116 may optically check alignments of the pick-up devices. In one or more embodiments, the alignment monitoring device 116 may include a machine vision system (e.g., an optics system such as a CMOS camera) controlled by the controller. The alignment monitoring device 116 can check an alignment of the pick-up devices: before picking up the semiconductor device from a wafer at the wafer holding device 112; while the semiconductor device is being transferred; before the semiconductor device is placed onto the carrier structure; and/or after the semiconductor device is placed onto the carrier structure.

The controller 118 of the system 100 is used to control device 10 to effect rotation of the rotatable transfer assemblies 104-1, 104-2, e.g., to cause the device 10 to drive the rotatable transfer assemblies 104-1, 104-2 to transfer a semiconductor device from the wafer at the wafer holding device 112 onto a bond surface of the carrier structure that is located at the carrier movement mechanism 114. Additionally, the controller 118, responsive to receipt of positional data determined by the alignment monitoring device 116, is operative to effect adjustment rotary movements of the rotatable transfer assemblies 104-1, 104-2. Also, the controller 118, responsive to receipt of positional data determined by the alignment monitoring device 116, is used to control device 10 to effect movement of the rotatable transfer assemblies 104-1, 104-2 in an axial direction. That is, to cause the axial actuator 106 to effect movement of the rotatable transfer assemblies in an axial direction relative to a plane of rotation of one or more transfer heads of the transfer assemblies. Further, the controller 118 is operative, responsive to receipt of positional data determined by the alignment monitoring device 116, to control pick-up device actuator 110 to effect movement of one or more pick-up devices in a radial direction.

Therefore, the controller 118 can adjust locations of one or more pick-up devices of the rotatable transfer assemblies 104-1, 104-2 in a tangential direction, a radial direction and/or an axial direction.

Figure 13:
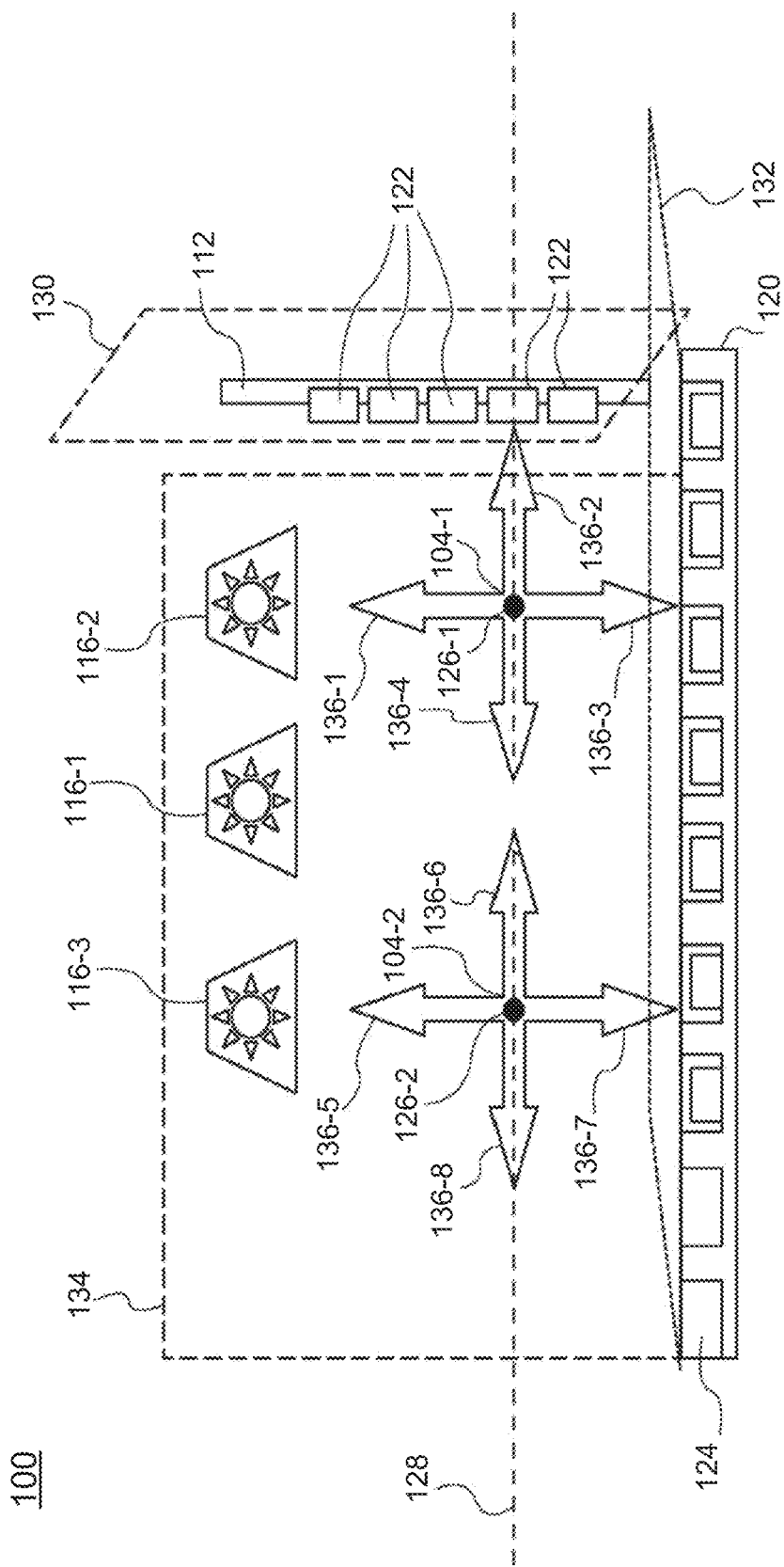
FIG. 13 schematically illustrates the system for transferring a semiconductor device from a wafer to a target.

FIG. 13 illustrates the system 100 in which centres of the rotatable transfer assemblies 104-1, 104-2 are positioned in parallel with a plane in which a bond surface of a carrier structure 120 that is positioned by the carrier movement mechanism 114 extends. In the semiconductor device transfer system 100 illustrated schematically in FIG. 13, two rotatable transfer assemblies 104-1, 104-2 are used to transfer semiconductor devices 122 (e.g. IC chips or dies) from a wafer held by a wafer holding device 112 onto a bond surface 124 of the carrier structure 120 that is positioned by the carrier movement mechanism. Alignment monitoring devices 116-1, 116-2, 116-3 are used to check the transfer of semiconductor devices in different positions. Rotating centres 126-1, 126-2 of the rotatable transfer assemblies 104-1, 104-2 are located at a dotted line 128 depicted in FIG. 13 (to depict horizontal alignment of the rotating centres 126-1, 126-2 in the illustrated embodiment, i.e. that the centres are in the same plane). In other embodiments, the axes of rotation of the rotatable transfer assemblies need not be horizontally aligned.

The wafer held by the wafer holding device 112 is located in a first plane 130 and is movable in that plane. The surface in which the target position lies (e.g. a surface of a carrier structure) extends in a second plane 132, which optionally may be parallel with the dotted line 128 and optionally may be perpendicular to the first plane 130. Reference numeral 134 denotes a third plane (i.e. a device transfer plane) in which a semiconductor device is picked up from the wafer and transferred to the carrier structure by the rotatable transfer assemblies 104-1, 104-2. Optionally the third plane 134 may be perpendicular to the first plane 130 and the second plane 132. The rotatable transfer assemblies 104-1, 104-2 and the alignment monitoring devices 116-1, 116-2, 116-3 illustrated in FIG. 13 are examples of the rotatable transfer assemblies 104-1, 104-2 and the alignment monitoring device 116 illustrated schematically in block diagram form in FIG. 12.

Each rotatable transfer assembly 104-1, 104-2 has multiple transfer heads, which can be any suitable number of transfer heads (e.g. four transfer heads or eight transfer heads). In the illustrated example of FIG. 2, the rotatable transfer assembly 104-1 has four transfer heads 136-1, 136-2, 136-3, 136-4 and the rotatable transfer assembly 104-2 also has four transfer heads 136-5, 136-6, 136-7, 136-8.

In general, a four head set-up moves in 4×90 degree incremental moves to complete a semiconductor die transfer cycle. After each move of 90 degrees, a process takes place, e.g. die pick-up at 3 o'clock, die inspection at 12 o'clock, die hand over at 9 o'clock, etc. Each transfer head is used to transfer one semiconductor device at a time. For example, within a transfer cycle, the transfer head 136-1 of the rotatable transfer assembly 104-1 can be used to pick up a first semiconductor device, the transfer head 136-2 can be used to transfer a second semiconductor device, the transfer head 136-3 can be used to transfer a third semiconductor device, and the transfer head 136-4 can be used to transfer a fourth semiconductor device. By positioning the second rotatable transfer assembly 104-2 next to the rotatable transfer assembly 104-1 and in parallel with the bond surface 124 of the carrier structure 120, the rotation of semiconductor devices in the transfer process is in parallel with the carrier structure. Consequently, the flip function of semiconductor devices can be enabled at a similar speed and using similar processes as a non-flip semiconductor transfer system.

Alignment monitoring devices 116-1, 116-2, 116-3 are located in different locations within the system 100 and are used to check the transfer of semiconductor devices in different positions. Specifically, the alignment monitoring device 116-1 is located between the rotatable transfer assembly 104-1 and the rotatable transfer assembly 104-2 and is used to check an alignment of transfer heads of the rotatable transfer assemblies 104-1, 104-2 at a transfer (handover) position. This check may determine if the transfer heads of one transfer assembly are aligned with those of another and/or may determine if the transfer heads of both transfer assemblies are aligned with a target location for the transfer position.

The alignment monitoring device 116-2 is located to monitor the rotatable transfer assembly 104-1 and can be used to check an alignment of transfer heads at a pick-up position and/or a transfer position. This check can determine if the transfer heads of rotatable transfer assembly 104-1 are aligned with a target location for the pick-up position. Optionally, the check may also determine if the transfer heads of rotatable transfer assembly 104-1 are aligned with those of the other rotatable transfer assembly 104-2 and/or with a target location for the transfer position.

The alignment monitoring device 116-3 is located to monitor the rotatable transfer assembly 104-2 and can be used to check an alignment of transfer heads at a transfer (handover) position and/or a die placement position, i.e. where the die is located for placement on the carrier structure 120. This check can determine if the transfer heads of rotatable transfer assembly 104-2 are aligned with a target location for the die placement position. Optionally, the check may also determine if the transfer heads of rotatable transfer assembly 104-2 are aligned with those of the other rotatable transfer assembly 104-1 and/or with a target location for the transfer position.

The alignment monitoring devices 116-1, 116-2, 116-3 can optically check the alignment of transfer heads, for example, by irradiating the pick-up position, handover position and die placement position with a light and checking the reflection of the light by the transfer heads at such positions.

Figure 14:
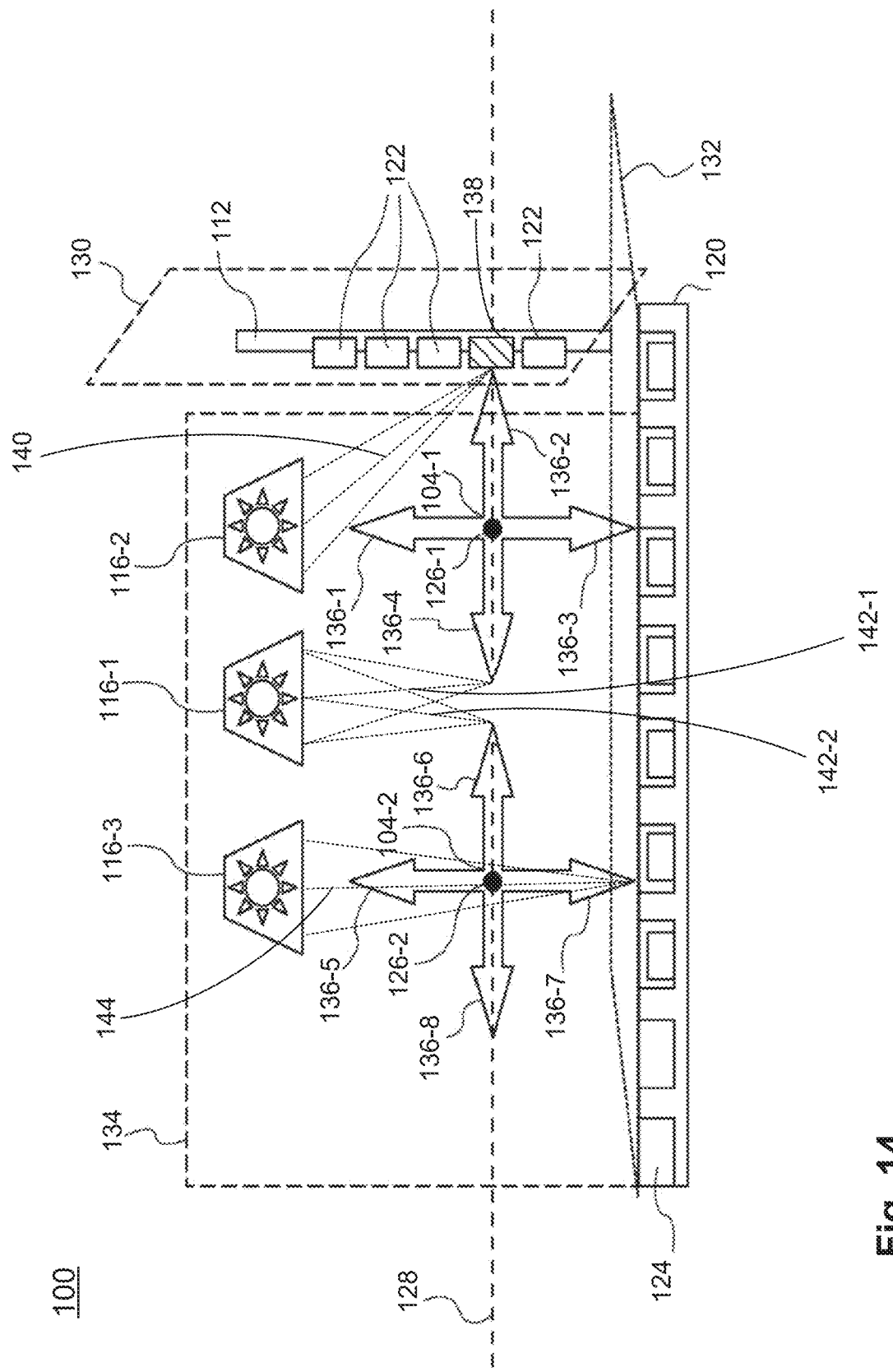
FIG. 14 schematically illustrates an alignment checking operation implemented by the system.

FIG. 14 illustrates the system 100 of FIG. 13 when an alignment check step is performed. This check step can be used to determine if: the transfer heads of rotatable transfer assembly 104-1 are aligned with a target location for the pick-up position; the transfer heads of one transfer assembly are aligned with those of another and/or the transfer heads of both transfer assemblies are aligned with a target location for the transfer position; and the transfer heads of rotatable transfer assembly 104-2 are aligned with a target location for the die placement position.

As shown in FIG. 14, alignment monitoring device 116-2 checks the alignment of the transfer heads 136-1, 136-2, 136-3, 136-4 of rotatable transfer assembly 104-1 relative to the wafer holding device 112 at a pick-up position 138. The alignment monitoring device 116-2 optically checks the alignment of the transfer heads 136-1, 136-2, 136-3, 136-4 of rotatable transfer assembly 104-1 relative to the wafer holding device 112. For example, the alignment monitoring device 116-2 checks the alignment of the transfer heads 136-1, 136-2, 136-3, 136-4 of rotatable transfer assembly 104-1 by shining light 140 toward a region of a pick-up position and checking the reflection of the light from that region so as to determine whether the transfer head 136-2 is aligned with the pick-up position. If the alignment check step determines that the transfer head 136-2 (and thus rotatable transfer assembly 104-1) is not properly aligned with the pick-up position, the controller 118 can, responsive to a signal containing positional data received from the alignment monitoring device 116-2, communicate alignment signals to at least one of the device 10 and pick-up device actuator 110 to cause a movement of the rotatable transfer assembly (and/or parts thereof) in at least one of an axial direction (i.e. in a direction into, or out of the page of the figure), a tangential direction (i.e. by rotating the transfer assembly 104-1), and a radial direction (i.e. by moving the tips of the pick-up devices of the transfer heads).

An alignment check at the transfer position (i.e. a position where the die is handed over from the rotatable transfer assembly 104-1 to the rotatable transfer assembly 104-2) is performed by the alignment monitoring device 116-1. For example, the alignment monitoring device 116-1 optically checks the alignment of rotatable transfer assemblies 104-1, 104-2 (to ensure that their transfer heads are located to rotate in the same plane). This is achieved by shining light 142-1 at a region of a transfer position and checking the reflection of the light from that region so as to determine whether the transfer heads 136-4, 136-6 are aligned with the transfer position and with one another. If the alignment check step determines that one, or both, of the transfer heads 136-4, 136-6 (and thus rotatable transfer assemblies 104-1, 104-2) are not properly aligned with the transfer position, the controller 118 can, responsive to a signal containing positional data received from the alignment monitoring device 116-1, communicate alignment signals to at least one of the device 10 and pick-up device actuator 110 to cause a movement of the rotatable transfer assemblies 104-1 and/or 104-2 (and/or parts thereof) in at least one of an axial direction (i.e. in a direction into, or out of the page of the figure), a tangential direction (i.e. by rotating the transfer assemblies 104-1 and/or 104-2), and a radial direction (i.e. by moving the tips of the pick-up devices of the transfer heads).

An alignment check at the target position, e.g. a placement position (i.e. a position where the die is placed on to the carrier structure 120) is performed by the alignment monitoring device 116-3. For example, the alignment monitoring device 116-3 optically checks the alignment of rotatable transfer assembly 104-2. This is achieved by shining light 144 at a region of a placement position so as to determine whether the transfer head 136-7 is aligned with the placement position. If the alignment check step determines that the transfer head 136-7 (and thus rotatable transfer assembly 104-2) are not properly aligned with the placement position, the controller 118 can, responsive to a signal containing positional data received from the alignment monitoring device 116-3, communicate alignment signals to at least one of the device 10 and pick-up device actuator 110 to cause a movement of the rotatable transfer assembly 104-2 (and/or parts thereof) in at least one of an axial direction (i.e. in a direction into, or out of the page of the figure), a tangential direction (i.e. by rotating the transfer assembly 104-2), and a radial direction (i.e. by moving the tips of the pick-up devices of the transfer heads).

After the alignment check step shown in FIG. 14 determines that the rotatable transfer assemblies 104-1, 104-2 are properly aligned, a semiconductor device is picked up from the wafer.

Figure 15:
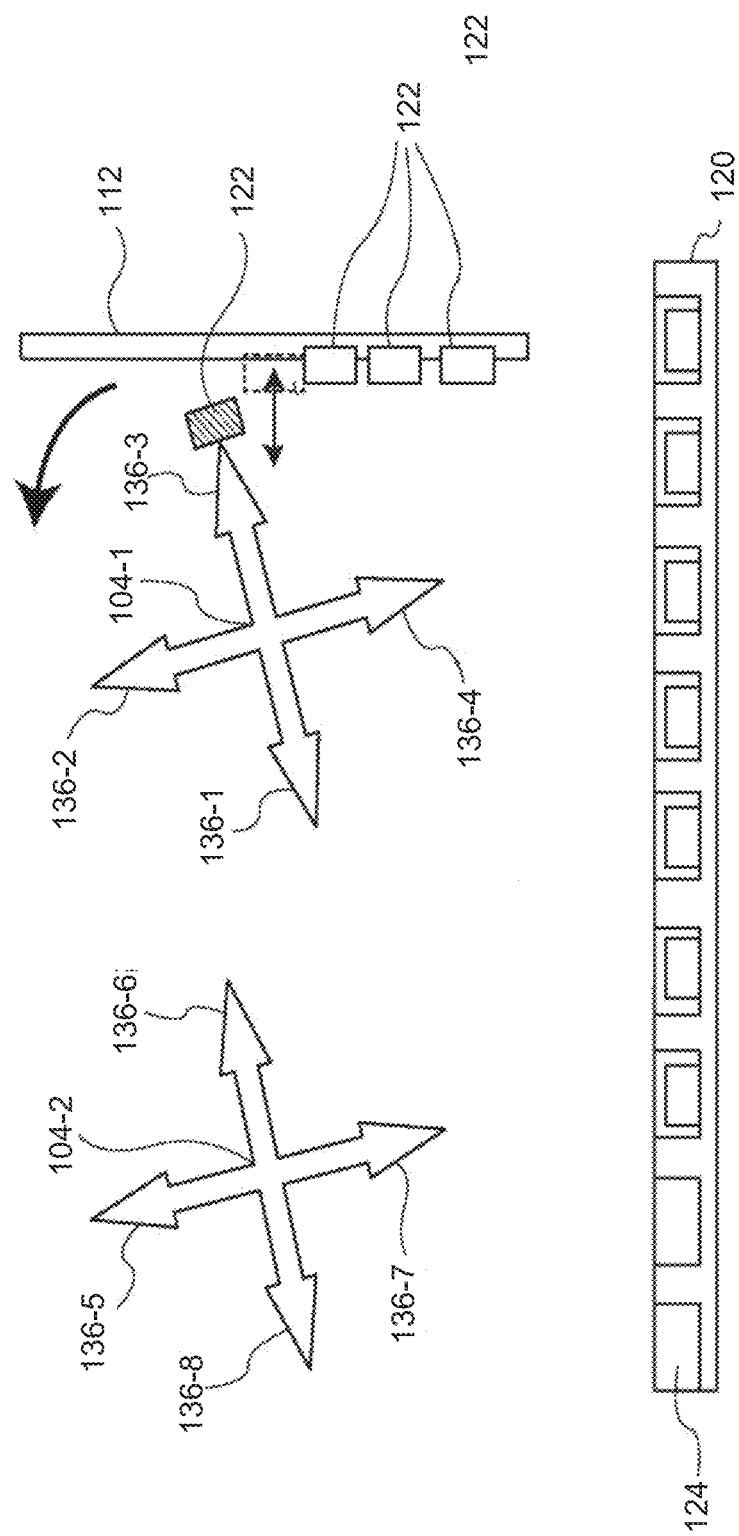
FIGS. 15 to 17 illustrate an example of a cycle of the system illustrated in FIG. 13.

FIG. 15 depicts the system 100 shortly after the semiconductor device is picked up from the wafer by the transfer head 136-3 of the rotatable transfer assembly 104-1. As shown in FIG. 15, the transfer head 136-3 of the rotatable transfer assembly 104-1 is rotated to carry the semiconductor device from the pick-up position. Further rotation of the rotatable transfer assembly 104-1 rotates the transfer head 136-4 to the chip pick-up position to pick up another semiconductor device. In this transfer move, the transfer head 136-2 is indexed to a die transfer position at 9 o'clock.

After the semiconductor device 122 is picked up from the wafer holding device 112, the rotatable transfer assembly 104-1 is rotated to transfer the semiconductor device to the rotatable transfer assembly 104-2.

Figure 16:
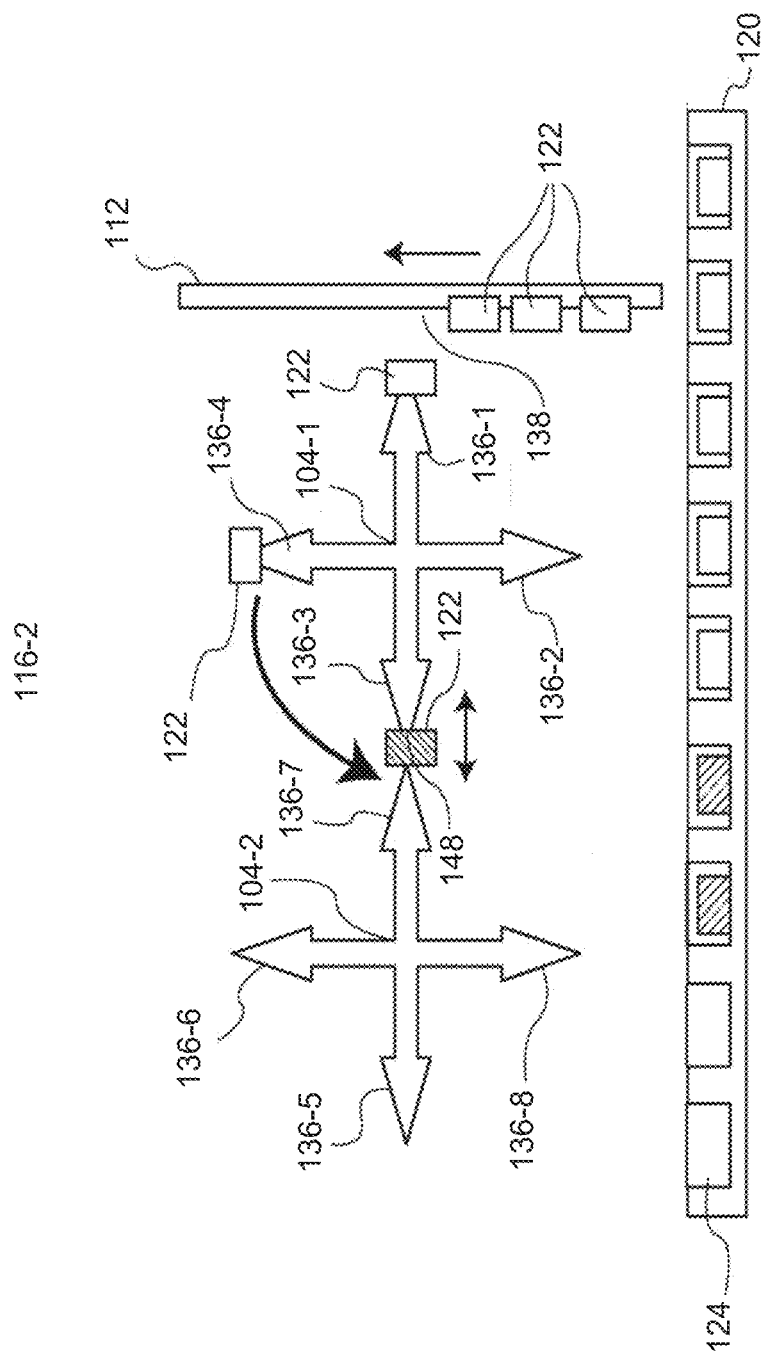

FIG. 16 depicts a semiconductor device transfer step in which the semiconductor device is transferred from the rotatable transfer assembly 104-1 to the rotatable transfer assembly 104-2. As shown in FIG. 16, the transfer head 136-3 of the rotatable transfer assembly 104-1 is rotated to a transfer (i.e. a handover or chip flip) position 148, from which the semiconductor device is picked up by the transfer head 136-7 of the rotatable transfer assembly 104-2. In one or more embodiments, the transfer head 136-3 of the rotatable transfer assembly 104-1 is rotated 180 degrees from the pick-up position 138 to the transfer position 148.

After the semiconductor device 122 is transferred to the rotatable transfer assembly 104-2, the rotatable transfer assembly 104-2 is rotated to place the semiconductor device onto the carrier structure 120. The semiconductor device (e.g., a semiconductor die) can be placed on a horizontal bond pad in a die bonding process. Alternatively, the semiconductor device (e.g., a semiconductor chip or a quad-flat no-leads (QFN) package) can be placed into a cavity of the blister tape or carrier tape in a die sorting or taping process.

Figure 17:
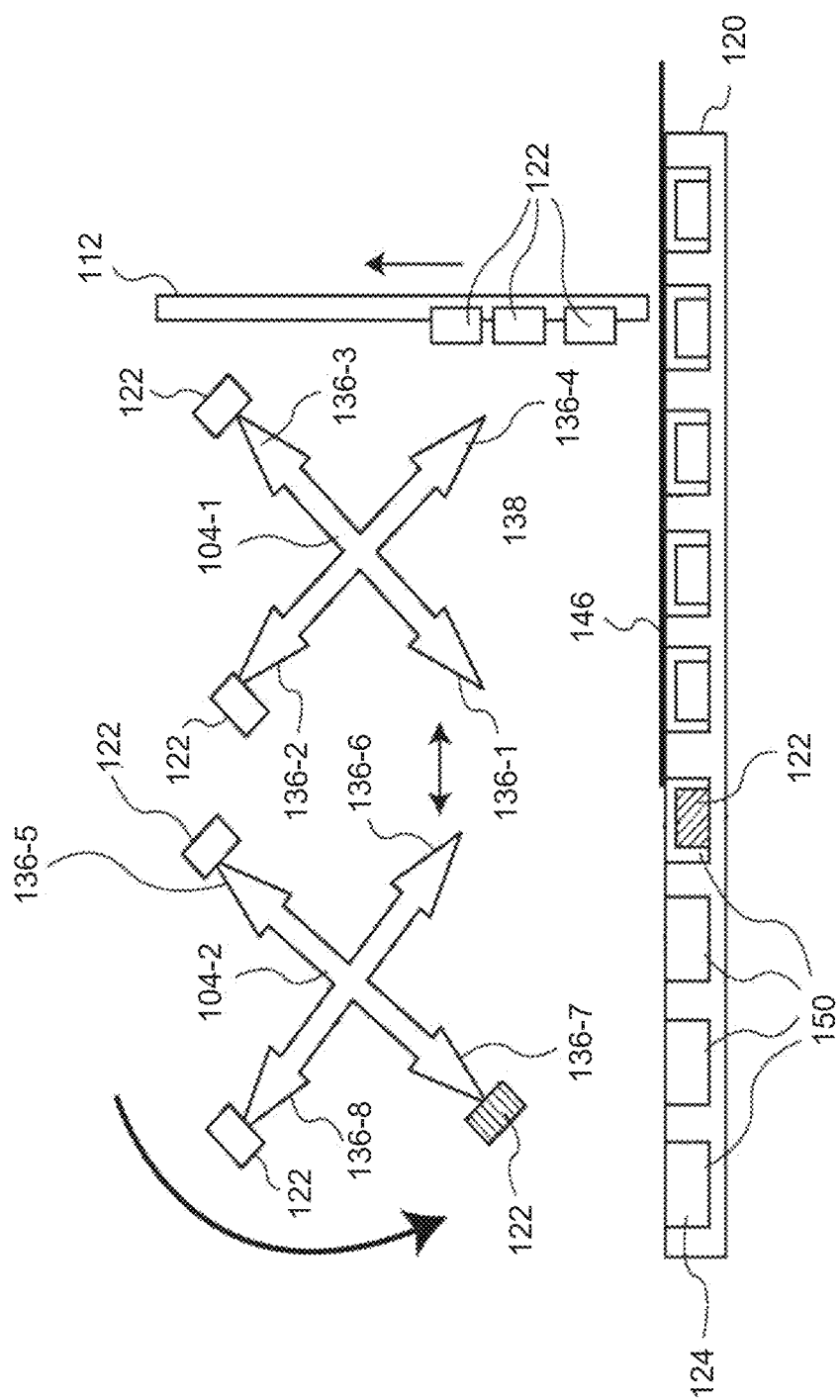

FIG. 17 depicts the system 100 before the semiconductor device 122 is transferred from the rotatable transfer assembly 104-2 onto the bond surface 124 of the carrier structure. As shown in FIG. 17, the transfer head 136-7 of the rotatable transfer assembly 104-2 is rotated to place the semiconductor device into an opening 150 (e.g., a gap or a hole) on the bond surface of the carrier structure. In some embodiments, the cover layer 146 (e.g. a tape layer) covers (e.g. rolls onto) the opening to seal the semiconductor device into the carrier structure 120.

Figure 18:
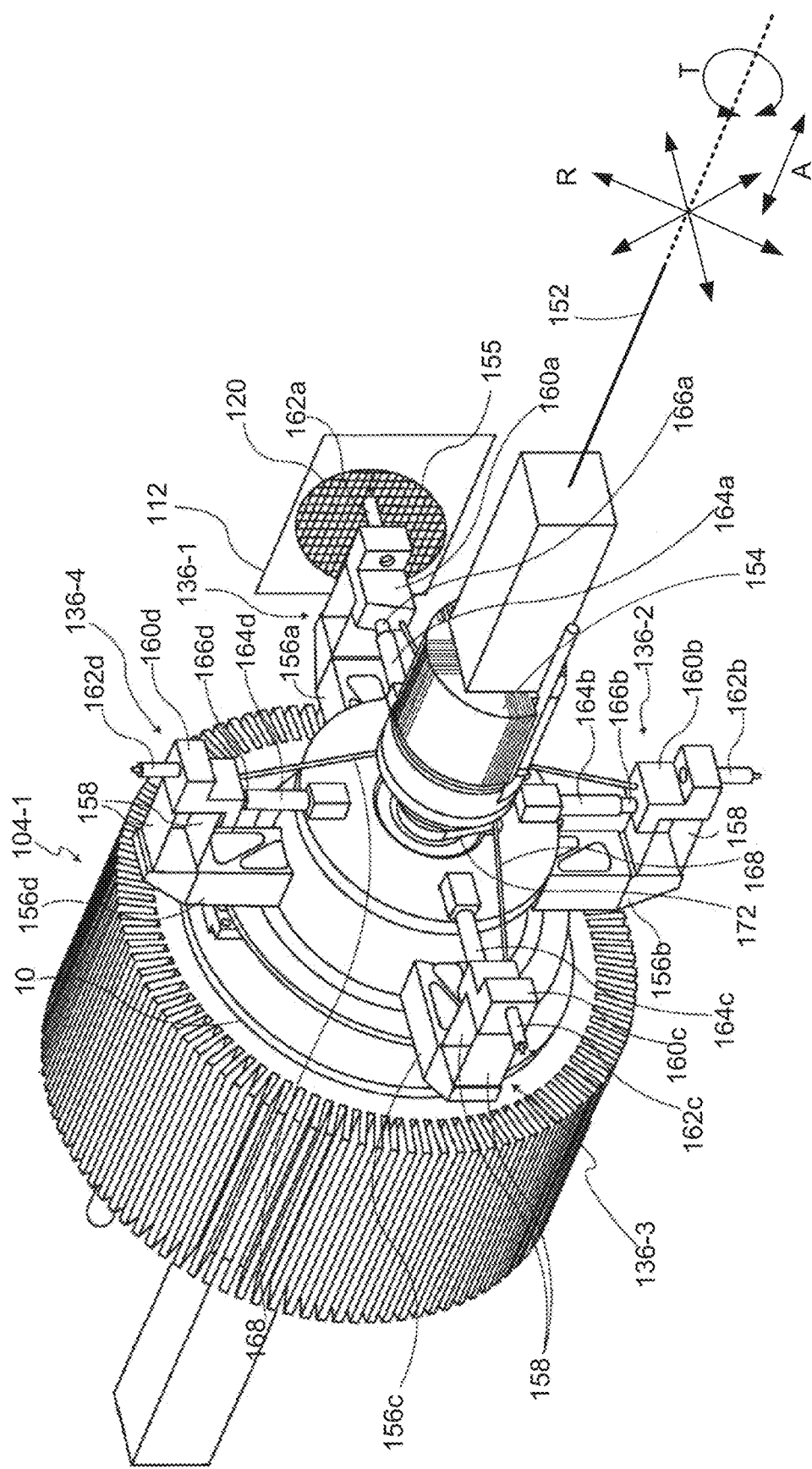
FIG. 18 illustrates an apparatus, incorporating a device according to one or more embodiments of the present disclosure, for transferring a semiconductor device from a wafer to a carrier structure.

FIG. 18 illustrates an embodiment of the rotatable transfer assembly 104-1 of FIG. 13. A rotatable transfer assembly 104-1 includes four transfer heads 136-1, 136-2, 136-3, 136-4. The rotatable transfer assembly is configured to rotate about an axis 152 and is driven by device 10 clock-wise or anti-clockwise (counter-clockwise) to control operational movement of the transfer assembly, and correction movements of the transfer assembly (i.e. small movements of the transfer heads for positional corrections—denoted by arrow T in the figure). A surface of a chip 120 on a wafer 155 is positioned opposite a transfer head 136 in a chip pickup position. In an operation of the rotating assembly, a chip 120 is picked up from the wafer 155 by the transfer head 136-1 and is rotated to a transfer, handover, or chip-flip position (i.e. to the location occupied by the transfer head 136-3 in the figure) after two index steps. The rotatable transfer assembly 104-2 depicted in FIG. 13 can be implemented the same as or similar to the rotatable transfer assembly 104-1 depicted in FIG. 18.

In the rotatable transfer assembly 104-1, each transfer head 136-1, 136-2, 136-3, or 136-4 includes an arm 156a-156d, respectively, a pair of parallel leaf springs 158, blocks 160a-160d, respectively, a collet 162a-162d, respectively, an arm 164a-164d, respectively, and pressure springs 166a-166d, respectively. Each collet 162a-162d is movable to and fro over a short distance essentially in the radial direction at right angles to the axis 152 (denoted by arrows R in the figure). Radial movement is effected by motor 154, which is controlled responsive to a signal received from the pick-up device actuator 110 (see FIG. 12).

The transfer heads are connected to device 10 that is used to drive the assembly about axis 152. Each arm 156a-156d extends essentially radially to the axis 152 from the rotatable transfer assembly. At, or proximal to, the ends of each of the arms 156a-156d, the ends of the pair of parallel leaf springs 158 are fixedly mounted and opposite ends of the pair of leaf springs 158 support the blocks 160a-160d, respectively. In each block 160a-160d, the collet 162a-162d, respectively, is fixedly mounted. The collet 162a-162d is used to pick up and hold a semiconductor device 120 (e.g., an IC chip or die) by suction, by force or by other applicable methods. Optionally, the collet may have at least one pick-up opening for picking up, holding, and releasing a semiconductor device by varying the pressure at the pick-up opening. When the collet is in a semiconductor device pick-up position, the pick-up opening is brought into close proximity to the semiconductor device, and a low pressure (e.g. a vacuum) is generated in the opening, whereby the semiconductor device is sucked to and against the opening. While maintaining the low pressure, the semiconductor device is transferred by the collet to another chip transfer position, and the semiconductor device can be released by applying a higher pressure to the pick-up opening.

Each transfer head also includes the arm 164a-164d, respectively, extending essentially radially to the axis 152 from the rotatable transfer assembly. The pressure springs 166a-166d are mounted between the ends of the arms 164a-164d and the respective blocks 160a-160d.

The block 160a of the transfer head 136-1 is connected to the block 160c of the transfer head 136-3 by a wire 168 and the block 160b of the transfer head 136-2 is connected to the block 160d of the transfer head 136-4 by a wire 168. The wire 168 is fixedly connected, e.g. clamped, to a lever, which is connected to a rotatable shaft driven by the motor.

Controller (not shown), responsive to receipt of a signal from the alignment monitoring device 116, operates to initiate an alignment process to achieve alignment of the transfer heads of the rotatable transfer assembly 104-1 with a target location at the pick-up position and/or at the transfer position. If the transfer position is a handover position to a second rotatable transfer assembly, the controller also operates to initiate an alignment process to achieve alignment of the transfer heads of the rotatable transfer assembly 104-1 with those of the second rotatable transfer assembly 104-2, and those of the second rotatable transfer assembly 104-2 with a placement position. The controller achieves this by sending a control signal to one or more of the device 10 and/or the pick-up device actuator 110. The device 10 effects movement of the transfer assembly (or assemblies) along axis 152 (i.e. in an axial direction denoted by arrow A). The device 10 also effects movement of the transfer heads of the transfer assembly (or assemblies) in a rotational direction (i.e. denoted by arrow T in the figure). The pick-up device actuator 110 controls motor 154 to effect movement of the transfer heads of the transfer assembly (or assemblies) in a radial direction (i.e. denoted by arrow R in the figure). Thus, the system can adjust transfer head positions in three-degrees of freedom.

Figure 19:
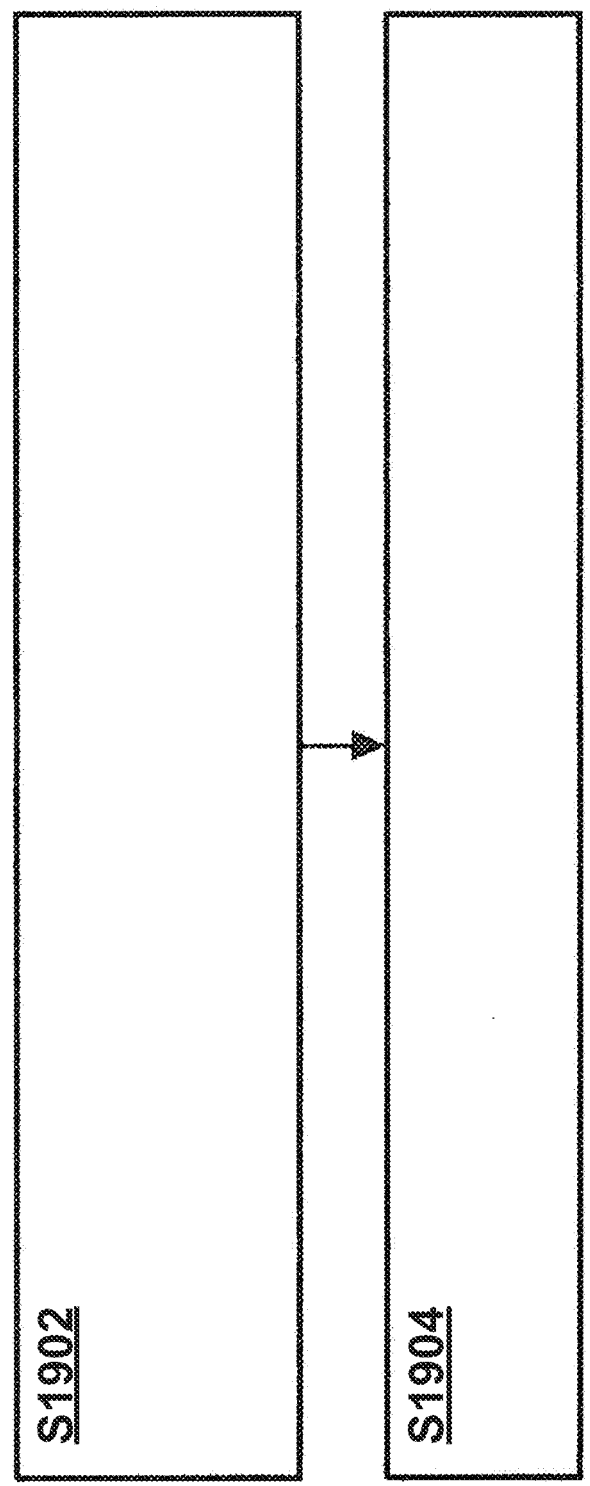
FIG. 19 shows a flowchart illustrating basic steps of a method for controlling an electric motor for linear and rotary movement.

FIG. 19 shows a flowchart illustrating basic steps of a method for controlling an electric motor for linear and rotary movement. In a step S1902, currents can be determined based on at least a number of coils or coil sets of a stator of the electric motor, an angle of rotation of a rotor of the electric motor and a parameter depending on an axial position of the rotor. In a step S1904, the determined currents may be supplied to the coils or coil sets.

Figure 20:
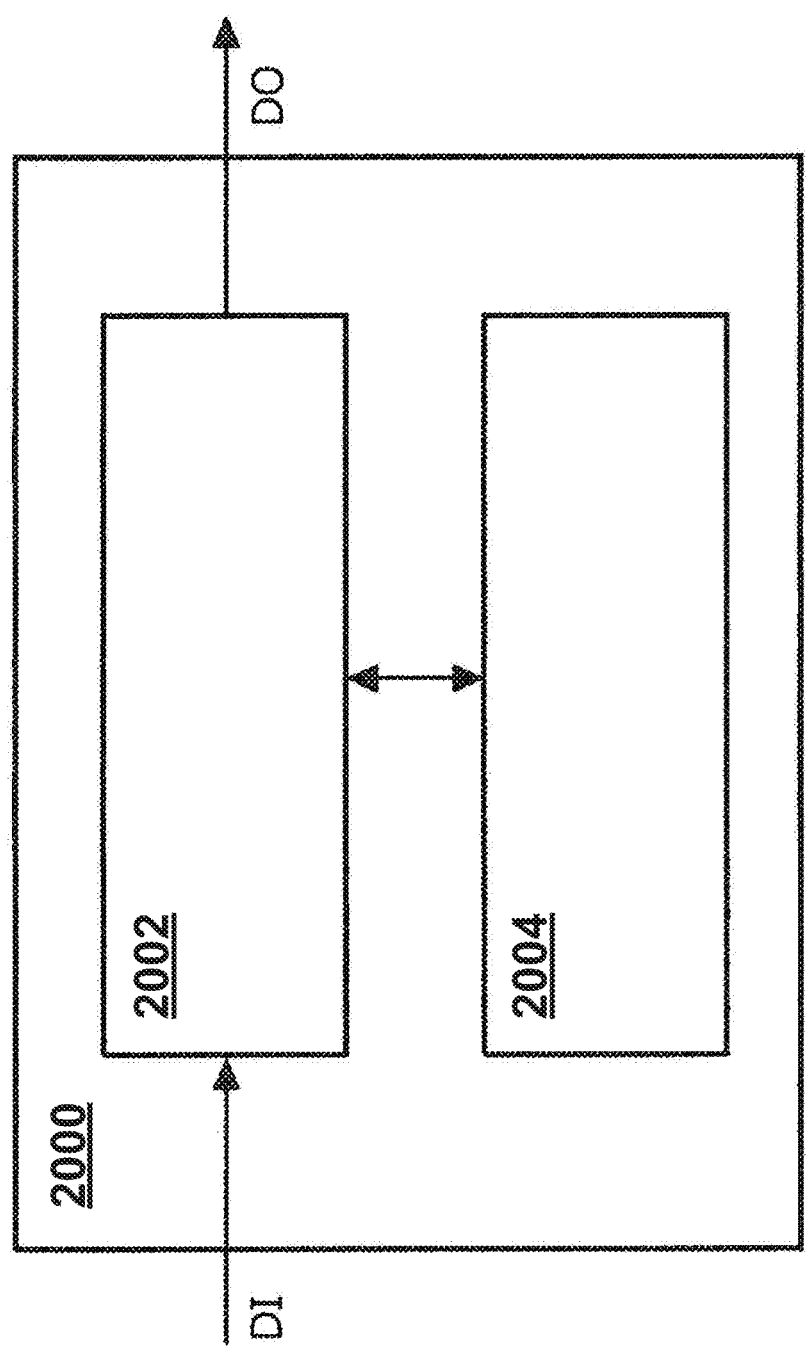
FIG. 20 shows an example of a software-based implementation of the method.

FIG. 20 shows an example of a software-based implementation of the method. Here, a device 2000 can comprise a processing unit (PU) 2002, which may be provided on a single chip or a chip module and which can be any processor or computer device with a control unit that performs control based on software routines of a control program stored in a memory (MEM) 2004. Program code instructions may be fetched from the MEM 2004 and loaded into the control unit of the PU 2002 in order to perform processing steps such as those described in connection with FIG. 19. The processing steps can be performed on the basis of input data DI and may generate output data DO. The input data DI may represent e.g. configuration and operation data of an electric motor, etc., and the output data DO can represent e.g. currents to be supplied to coils or coil sets of the electric motor, etc.

The above described device may be applied to actuators that can be used e.g. in pick-and-place machines, chirurgical drills, focus and zoom motors in photo and video equipment, car transmissions, compact disc (CD) and digital versatile disc (DVD) players, etc.

The above described device may enable a torque and an axial force to be generated independently of one another and on the basis of a standard motor. Thus, a translating and rotating movement may be implemented without the need for a specifically designed motor or complex electronics and control techniques. In this way, one can save on an extra motor or a difficult design path. A commutation algorithm based on values sensed by first and second sensors may be implemented. Hence, currents to be supplied to coils or coil sets can be determined such that a torque and an axial force may be generated largely independent of each other (decoupled) at all times. This can be possible without a feedback of the currents, i.e. without a current sensor. Thus, there may be no feedback loop comprising controllers and also no effort for controller tuning.

In summary, one or more embodiments of the present disclosure relate to a device, an apparatus incorporating the device, and a system incorporating the apparatus for enabling a rotating and translating movement by means of a single motor. An electric motor for linear and rotary movement can comprise a stator having a multi-phase coil arrangement including a number of coils or coil sets and a rotor being movable along a direction of its rotational axis and having a number of poles respectively comprising at least one permanent magnet. A control unit may determine currents based on at least the number of coils or coil sets, an angle of rotation of the rotor and a parameter depending on an axial position of the rotor, and supply the determined currents to the coils or coil sets. A back iron is disposed on said rotor, said stator, or on both said rotor and said stator.

While the present disclosure has been illustrated and described in detail in the drawings and foregoing description, such illustration and description are to be considered illustrative or exemplary and not restrictive. The disclosure is not limited to the disclosed embodiment. For example, while it is described above that the control unit 18 may determine currents to be supplied to coils or coil sets of the stator, i.e. motor currents, this can also be done by other hardware such as e.g. analogue hardware. Such hardware may be e.g. a power amplifier for the motor currents. One embodiment can be where two Hall sensors are used to measure the position dependent magnetic field of the magnet. These sensors may be spatially 90 degrees apart, and the positions of the sensors with respect to the coils can be fixed (and known). The two Hall signals may be fed to the analogue device that can be part of the power amplifier. These Hall signals may be sinusoidal as a function of the rotation angle ($\Phi$). A sum of linear combination of these two signals (phase shifted) can give the desired motor currents. In general, rotational position information may enter the analogue device together with desired force and torque set points, based on which the desired currents for the different motor coils can be determined. Other hardware than that described above may also be used alternatively or additionally in order to determine the desired currents.

Variations to the disclosed embodiment can be understood and effected by those skilled in the art in practicing the claimed disclosure, from a study of the drawings, the disclosure, and the appended claims.

In the claims, the word "comprising" does not exclude other elements or steps, and the indefinite article "a" or "an" does not exclude a plurality. A single processor or other unit may fulfil the functions of several items recited in the claims.

A computer program capable of controlling a processor to perform the claimed features can be stored/distributed on a suitable medium, such as an optical storage medium or a solid-state medium supplied together with or as part of other hardware, but may also be distributed in other forms, such as via the Internet or other wired or wireless telecommunication systems. It can be used in conjunction with a new system, but may also be applied when updating or upgrading existing systems in order to enable them to perform the claimed features.

A computer program product for a computer can comprise software code portions for performing e.g. processing steps such as those described in connection with FIG. 19 when the computer program product is run on the computer. The computer program product may further comprise a computer-readable medium on which the software code portions are stored, such as e.g. an optical storage medium or a solid-state medium.

Any reference signs in the claims should not be construed as limiting the scope thereof.

Particular and preferred aspects of the disclosure are set out in the accompanying independent claims. Combinations of features from the dependent and/or independent claims may be combined as appropriate and not merely as set out in the claims.

What is claimed is:

1. A device comprising:
   a single electric motor for linear and rotary movement comprising:
     a stator, said stator comprising a multi-phase coil arrangement and a plurality of coils or coil sets; and
     a rotor, said rotor movable in an axial direction of a rotational axis thereof;
     wherein said rotor further comprises a plurality of poles respectively comprising at least one permanent magnet; and
   a control unit configured to determine currents ($I_r$, $I_s$, $I_t$) by calculation formulas and based on at least a number of coils or coil sets of said plurality of coils or coil sets;
   an angle of rotation of said rotor and a parameter depending on an axial position of said rotor, wherein each current ($I_r$, $I_s$, $I_t$) comprises a current component ($I_{r\Phi}$, $I_{s\Phi}$, $I_{t\Phi}$) for generating a torque and a current component ($I_{rx}$, $I_{sx}$, $I_{tx}$) for generating an axial force, and to supply said determined currents in an open loop to said number of coils or coil sets, wherein the sum of the currents is zero, and wherein at least one of: said stator and said rotor, comprises a back-iron.

2. The device according to claim 1, wherein said single electric motor further comprises at least one rotor topology of the group consisting of an outer rotor topology, an inner rotor topology, and combinations thereof.

3. The device according to claim 1, further comprising: a first sensor configured to sense said angle of rotation and supply it to said control unit, and a second sensor configured to sense said axial position of said rotor and supply it to said control unit.

4. The device according to claim 2, further comprising: a first sensor configured to sense said angle of rotation and supply it to said control unit, and a second sensor configured to sense said axial position of said rotor and supply it to said control unit.

5. The device according to claim 1, further comprising a bearing system configured to bear said rotor and constrain all degrees of freedom except for a linear degree of freedom along said rotational axis and a rotational degree of freedom around said rotational axis.

6. The device according to claim 5, wherein said bearing system further comprises an active magnetic bearing system.

7. The device according to claim 1, wherein said parameter changes, and wherein said parameter changes are inversely proportional as a function of said axial position.

8. The device according to claim 1, wherein said control unit is configured to determine said currents based also on a further parameter that is independent of said axial position.

9. The device according to claim 1, wherein said control unit is configured to determine a current for:
   a first coil or coil set as:
   $$I_r = I_{r\Phi} + I_{rx} = A\sin(n(\Phi-\theta)) + B\cos(n(\Phi-\theta));$$
   a current for a second coil or coil set as:
   $$I_s = I_{s\Phi} + I_{sx} = A\sin(n(\Phi-\theta)-(2\pi/3n)) + B\cos(n(\Phi-\theta)-(2\pi/3n));$$
   and
   a current for a third coil or coil set as:
   $$I_t = -I_r - I_s = I_{t\Phi} + I_{tx} = A\sin(n(\Phi-\theta)+(2\pi/3n)) + B\cos(n(\Phi-\theta)+(2\pi/3n)),$$
   wherein A is said parameter depending on said axial position, n is a number of magnet pole pairs, $\Phi$ is said angle of rotation, $\theta$ is an alignment angle between 0 and $2\pi/n$, and B is a further parameter.

10. The device according to claim 1, wherein said single electric motor is a direct current electric motor.

11. An apparatus for transferring a semiconductor device from a wafer to a target position, comprising:
    a device according to claim 1; and
    a rotatable transfer assembly comprising a transfer head rotatable about an axis of rotation of said rotatable transfer assembly to transfer a semiconductor device from a pick-up position to a transfer position and moveable in an axial direction relative to a plane of rotation of said transfer head;
    wherein said rotation and/or axial movement of said transfer head is implemented by said device.

12. The apparatus according to claim 11, wherein said rotatable transfer assembly is configured to rotate said transfer head thereof to said pick-up position and rotate said transfer head to said transfer position.

13. The apparatus according to claim 11, wherein said transfer position comprises said target position,
    wherein said target position comprises a position where said semiconductor device is located for placement on a carrier structure.

14. The apparatus according to claim 13,
    wherein said target position comprises the position where said semiconductor device is located for placement on the carrier structure; and
    wherein the carrier structure is a carrier tape or a leadframe.

15. The apparatus according to claim 11, wherein said rotatable transfer assembly is moveable in said axial direction simultaneously with transfer of said semiconductor device at said transfer position.

16. The apparatus according to claim 13, wherein said rotatable transfer assembly is moveable in said axial direction simultaneously with transfer of said semiconductor device at said transfer position.

17. An apparatus for aligning a substrate, comprising:
    a device according to claim 1;
    a substrate conveying apparatus configured to convey said substrate in a transport direction for processing of said substrate in a processing location;
    a substrate position detector configured to detect a position of an indexing element on said substrate;

a misalignment detector configured to determine if a detected position of said indexing element is coincident with a desired position in said processing location at which processing can occur; and wherein, responsive to determination of a misalignment between said detected position and said desired position, said device is configured to adjust a position of said substrate in said transport direction and/or in a direction lateral to said transport direction so that said position of said indexing element is coincident with said desired position.

18. An apparatus for aligning a substrate, comprising:

a device according to claim 9;

a substrate conveying apparatus configured to convey said substrate in a transport direction for processing of said substrate in a processing location;

a substrate position detector configured to detect a position of an indexing element on said substrate; and a misalignment detector configured to determine if a detected position of said indexing element is coincident with a desired position in said processing location at which processing can occur;

wherein, responsive to determination of a misalignment between said detected position and said desired position, said device is configured to adjust a position of said substrate in said transport direction and/or in a direction lateral to said transport direction so that said position of said indexing element is coincident with said desired position.

* * * * *